(12) United States Patent
Mallikarjunaswamy et al.

(10) Patent No.: US 9,214,534 B2
(45) Date of Patent: Dec. 15, 2015

(54) LATERAL PNP BIPOLAR TRANSISTOR FORMED WITH MULTIPLE EPITAXIAL LAYERS

(71) Applicant: Alpha and Omega Semiconductor Incorporated, Sunnyvale, CA (US)

(72) Inventors: Shekar Mallikarjunaswamy, San Jose, CA (US); Francois Hebert, San Mateo, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/539,812

(22) Filed: Nov. 12, 2014

(65) Prior Publication Data

US 2015/0069464 A1 Mar. 12, 2015

Related U.S. Application Data

(63) Continuation of application No. 13/243,002, filed on Sep. 23, 2011, now Pat. No. 8,916,951.

(51) Int. Cl.
*H01L 29/49* (2006.01)
*H01L 29/735* (2006.01)
(Continued)

(52) U.S. Cl.
CPC ............ *H01L 29/735* (2013.01); *H01L 21/761* (2013.01); *H01L 29/0646* (2013.01); *H01L 29/0808* (2013.01); *H01L 29/0821* (2013.01); *H01L 29/1008* (2013.01);
(Continued)

(58) Field of Classification Search
CPC ... H01L 29/735; H01L 29/402; H01L 29/407; H01L 29/41708; H01L 29/41766; H01L 29/42304; H01L 29/6625; H01L 29/66659; H01L 29/7835; H01L 29/0808; H01L 29/0821; H01L 29/1008
See application file for complete search history.

(56) References Cited

U.S. PATENT DOCUMENTS 3,573,571 A 4/1971 Brown et al.
4,005,451 A 1/1977 Martinelli et al.
(Continued)

FOREIGN PATENT DOCUMENTS

CN 102104064 10/2012
JP H02114645 4/1990

OTHER PUBLICATIONS

Dr. Alan Doolittle, Lecture 15, Process Integration Reading: Selections from Chapters 15-18, Georgia Institute of Technology, ECE 6450 Lecture Notes, 10 pages; published date unknown; available on-line as of Mar. 31, 2008.

(Continued)

*Primary Examiner* — Michael Shingleton
(74) *Attorney, Agent, or Firm* — Van Pelt, Yi & James LLP

(57) ABSTRACT

A lateral bipolar transistor with deep emitter and deep collector regions is formed using multiple epitaxial layers of the same conductivity type. Deep emitter and deep collector regions are formed without the use of trenches. Vertically aligned diffusion regions are formed in each epitaxial layer so that the diffusion regions merged into a contiguous diffusion region after annealing to function as emitter or collector or isolation structures. In another embodiment, a lateral trench PNP bipolar transistor is formed using trench emitter and trench collector regions. In yet another embodiment, a lateral PNP bipolar transistor with a merged LDMOS transistor is formed to achieve high performance.

15 Claims, 45 Drawing Sheets

(51) Int. Cl.
*H01L 29/66* (2006.01)
*H01L 29/78* (2006.01)
*H01L 29/08* (2006.01)
*H01L 29/10* (2006.01)
*H01L 21/761* (2006.01)
*H01L 29/06* (2006.01)
*H01L 29/739* (2006.01)
*H01L 29/40* (2006.01)
*H01L 29/417* (2006.01)
*H01L 29/423* (2006.01)
*H01L 21/265* (2006.01)

(52) U.S. Cl.
CPC ..... *H01L 29/41766* (2013.01); *H01L 29/6625* (2013.01); *H01L 29/66659* (2013.01); *H01L 29/7393* (2013.01); *H01L 29/7835* (2013.01); *H01L 21/26586* (2013.01); *H01L 29/402* (2013.01); *H01L 29/407* (2013.01); *H01L 29/41708* (2013.01); *H01L 29/42304* (2013.01)

(56) References Cited

U.S. PATENT DOCUMENTS

| | | | |
|---|---|---|---|
| 4,283,236 | A | 8/1981 | Sirsi |
| 4,733,287 | A | 3/1988 | Bower |
| 5,034,337 | A | 7/1991 | Mosher et al. |
| 5,153,697 | A | 10/1992 | Mosher et al. |
| 5,273,913 | A | 12/1993 | Divakaruni et al. |
| 5,326,710 | A | 7/1994 | Joyce et al. |
| 5,420,457 | A | 5/1995 | Shibib |
| 5,455,450 | A | 10/1995 | Leduc |
| 5,486,481 | A | 1/1996 | Sundaram |
| 5,488,003 | A | 1/1996 | Chambers et al. |
| 5,614,424 | A | 3/1997 | Wong et al. |
| 5,856,697 | A | 1/1999 | Chambers et al. |
| 6,249,031 | B1 | 6/2001 | Verma et al. |
| 6,365,447 | B1 | 4/2002 | Hebert et al. |
| 6,611,044 | B2 | 8/2003 | Pruijmboom et al. |
| 7,064,407 | B1 | 6/2006 | Mallikarjunaswamy |
| 2005/0035412 | A1 | 2/2005 | Norstrom et al. |
| 2007/0145529 | A1 | 6/2007 | Otake et al. |
| 2008/0138953 | A1 | 6/2008 | Challa et al. |
| 2008/0290463 | A1 | 11/2008 | Stecher |
| 2009/0091306 | A1* | 4/2009 | Hojo et al. ............ 323/273 |
| 2009/0166721 | A1 | 7/2009 | Denison et al. |
| 2009/0206376 | A1 | 8/2009 | Mita et al. |
| 2010/0044791 | A1 | 2/2010 | Hebert |
| 2011/0115047 | A1 | 5/2011 | Hebert et al. |
| 2011/0127606 | A1 | 6/2011 | Bobde et al. |

OTHER PUBLICATIONS

Barnaby et al., The Effects of Emitter-Tied Field Plates on Lateral PNP Ionizing Radiation Response, IEEE Nuclear and Space Radiation Effects Conference, Newport Beach, CA (United States), 7 pages, Jul. 20-24, 1998, published Mar. 1, 1998.

Author Unknown, University of Texas Arlington, EE4345 Lecture Notes Spring 2002, L16B_5354_Sp02.pdf, 14 pages, published Mar. 7, 2001.

* cited by examiner

LATERAL PNP BIPOLAR TRANSISTOR FORMED WITH MULTIPLE EPITAXIAL LAYERS

CROSS-REFERENCE TO RELATED APPLICATIONS

This application is a continuation of co-pending U.S. patent application Ser. No. 13/243,002, entitled LATERAL PNP BIPOLAR TRANSISTOR FORMED WITH MULTIPLE EPITAXIAL LAYERS, filed Sep. 23, 2011 which is incorporated herein by reference for all purposes.

The present application is related to and commonly assigned U.S. patent application entitled "Lateral PNP Bipolar Transistor with Narrow Trench Emitter," of the same inventors hereof, having patent application Ser. No. 13/242,970, which patent application is incorporated herein by reference in its entirety.

FIELD OF THE INVENTION

The invention relates to lateral bipolar transistors and, in particular, to lateral bipolar transistors with deep emitter and collector regions formed using multiple epitaxial layers.

DESCRIPTION OF THE RELATED ART

Lateral bipolar transistors include emitter and collector regions formed in a substrate functioning as the base of the transistor. The emitter and collector are formed such that lateral current flow in an area in the substrate relatively remote from the surface of the substrate. Lateral PNP bipolar transistors are known but existing lateral PNP bipolar transistors typically has limited performance.

Furthermore, lateral PNP bipolar transistors have associated with it a parasitic substrate PNP device. The parasitic PNP device is formed between the P-emitter, the N-base and the P-substrate in the vertical direction. Because this vertical parasitic PNP device can have significant current gain, it is necessary to disable this parasitic device to avoid interfering with the main lateral PNP device. Therefore, most existing lateral PNP transistor includes an N+ buried layer under the P-emitter where the high doping of the N+ buried layer effectively null the gain of the parasitic device.

SUMMARY OF THE INVENTION

According to one embodiment of the present invention, a lateral bipolar transistor includes a semiconductor substrate of a first conductivity type; a first buried layer of the first conductivity type and a second buried layer of the second conductivity type both formed on the substrate where the second conductivity type being opposite the first conductivity type; and two or more epitaxial layers of the second conductivity type formed successively on the substrate where each epitaxial layer includes two or more diffusion regions formed therein. The diffusion regions formed in one epitaxial layer are in vertical alignment with the diffusion regions formed in an adjacent epitaxial layer. A first set of diffusion regions in vertical alignment forms a contiguous diffusion region of the first conductivity type and functions as an emitter region, and a second set of diffusion regions in vertical alignment forms a contiguous diffusion region of the first conductivity type and functions as a collector region. A base region is formed in the one or more epitaxial layers between the emitter and collector regions.

According to another embodiment of the present invention, a method for fabricating a lateral bipolar transistor includes providing a semiconductor substrate of a first conductivity type; forming a first buried layer of the first conductivity type and a second buried layer of a second conductivity type in the substrate where the second conductivity type is opposite the first conductivity type; forming one or more epitaxial layer of the second conductivity type successively on the substrate; forming two or more diffusion regions in each epitaxial layer where the diffusion regions formed in one epitaxial layer are in vertical alignment with the diffusion regions formed in an adjacent epitaxial layer; and annealing the semiconductor substrate and the one or more epitaxial layer. A first set of diffusion regions in vertical alignment forms a contiguous diffusion region of the first conductivity type and functions as an emitter region, and a second set of diffusion regions in vertical alignment forms a contiguous diffusion region of the first conductivity type and functions as a collector region. A base region is formed in the one or more epitaxial layers between the emitter and collector regions.

According to yet another embodiment of the present invention, a lateral trench PNP bipolar transistor is formed using trench emitter and trench collector regions. The lateral trench PNP transistor can be gated for breakdown voltage control. In another embodiment, a lateral PNP bipolar transistor with a merged LDMOS transistor is formed to achieve high performance.

The present invention is better understood upon consideration of the detailed description below and the accompanying drawings.

DETAILED DESCRIPTION OF THE PREFERRED EMBODIMENTS

Figure 1A:
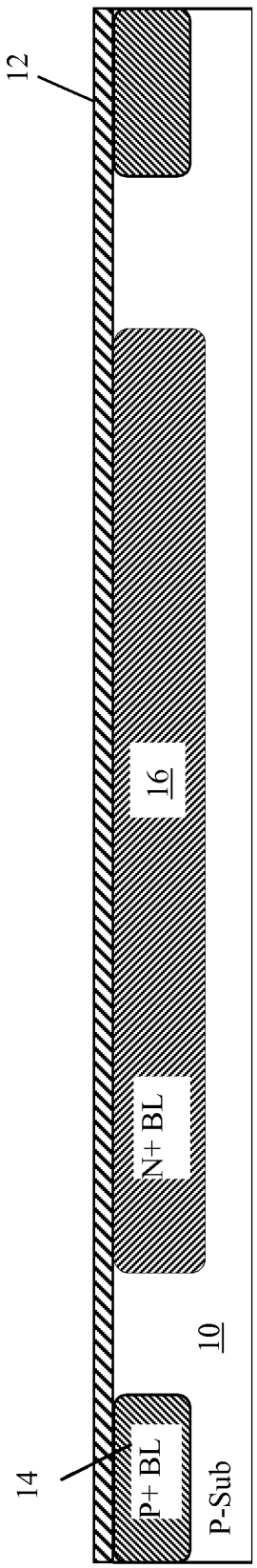
FIGS. 1A-1K are cross-sectional views illustrating the process step for fabricating a lateral PNP bipolar transistor according to embodiments of the present invention.

In accordance with the principles of the present invention, a lateral bipolar transistor includes trench emitter and trench collector regions to form ultra-narrow emitter regions, thereby improving emitter efficiency. A salient feature of the lateral bipolar transistor of the present invention is that the same trench process is used to form the emitter/collector trenches as well as the trench isolation structures so that no additional processing steps are needed to form the trench emitter and collector. In embodiments of the present invention, the lateral bipolar transistor is a PNP bipolar transistor. In embodiments of the present invention, the trench emitter and trench collector regions may be formed using ion implantation into trenches formed in a semiconductor layer. In other embodiments, the trench emitter and trench collector regions may be formed by out-diffusion of dopants from heavily doped polysilicon filled trenches.

According to another aspect of the present invention, a lateral bipolar transistor with deep emitter and deep collector regions is formed using multiple epitaxial layers of the same conductivity type. Deep emitter and deep collector regions are formed without the use of trenches. In one embodiment, a lateral PNP bipolar transistor is formed with two or more N-type Epitaxial layer. Heavily doped P+ regions are formed in each epitaxial layer and are vertically aligned with each other so that the heavily doped regions diffuse and merge into a single vertical diffusion region after anneal, forming deep emitter and deep collector regions.

In other embodiments of the present invention, a lateral trench PNP bipolar transistor is formed using trench emitter and trench collector regions. The lateral trench PNP transistor can be gated for breakdown voltage control. In another embodiment, a lateral PNP bipolar transistor with a merged LDMOS transistor is formed to achieve high performance.

The lateral bipolar transistors of the present invention realize high performance with improved emitter and collector efficiency. The lateral bipolar transistors also realize minimized substrate injection and parasitic substrate PNP effect. Importantly, the lateral bipolar transistors of the present invention realize high current gain at high current densities. Moreover, the lateral bipolar transistors of the present invention are constructed using structures that are compatible with standard CMOS or BCD (Bipolar-CMOS-DMOS) technologies. Therefore, the lateral bipolar transistors of the present invention can be readily integrated into existing fabrication processes.

(1) Lateral PNP Using Isolation Structures for Trench Emitter and Collector and P+ Implantation into Trenches In a first embodiment of the present invention, the trench emitter and trench collector are formed by ion implantation into the sidewall of trenches formed in a semiconductor layer. A bottom portion of the trench is lined with a thin sidewall oxide layer with the remaining portion filled with polysilicon. The thin sidewall oxide layer at the bottom portion of the trenches has the effect of preventing emitter-to-base breakdown at the bottom corners of the trenches.

The fabrication process and the structure of the lateral PNP transistor of the present invention will now be described with reference to FIGS. 1A to 1K. Referring to FIGS. 1A to 1K, the lateral PNP transistor is formed on a P-type silicon substrate 10. A buffer oxide layer 12 may be formed on the top surface of the substrate 10 before the ion implantation steps that follow to form P+ buried layer 14 and N+ buried layer 16. The P+ buried layer 14 and the N+ buried layer 16 are formed using separate masking and ion implantation steps. One or more anneals can be performed to drive in the implanted dopants, thereby forming the buried layers as shown in FIG. 1A.

Figure 1B:
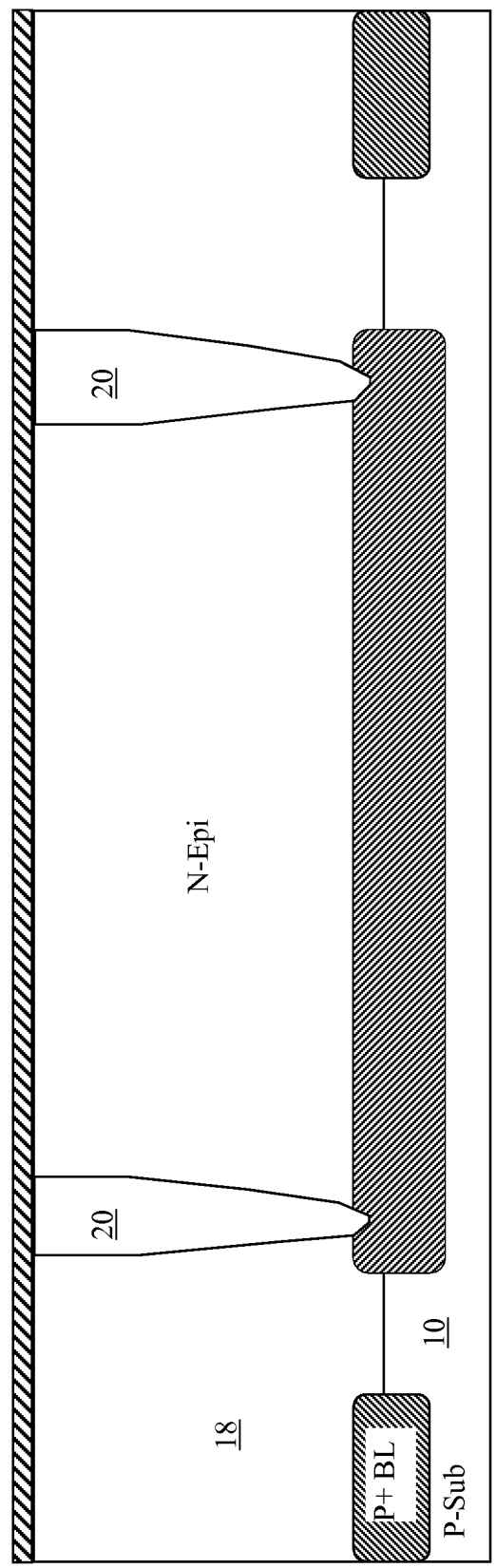

The buffer oxide layer 12 is then removed and an N-type Epitaxial layer 18 is formed on the substrate 10, as shown in FIG. 1B. In some embodiments, a buffer oxide is formed and then a masking and high dose phosphorus ion implantation step is performed to form N+ sinkers 20 which are heavily doped N-type regions for contacting the N+ buried layer. N+ sinkers 20 are optional and may be omitted in some embodiments of the present invention. In an alternate embodiment, N-type Epitaxial layer 18 is doped to a dopant level typically used for N-wells.

Figure 1C:
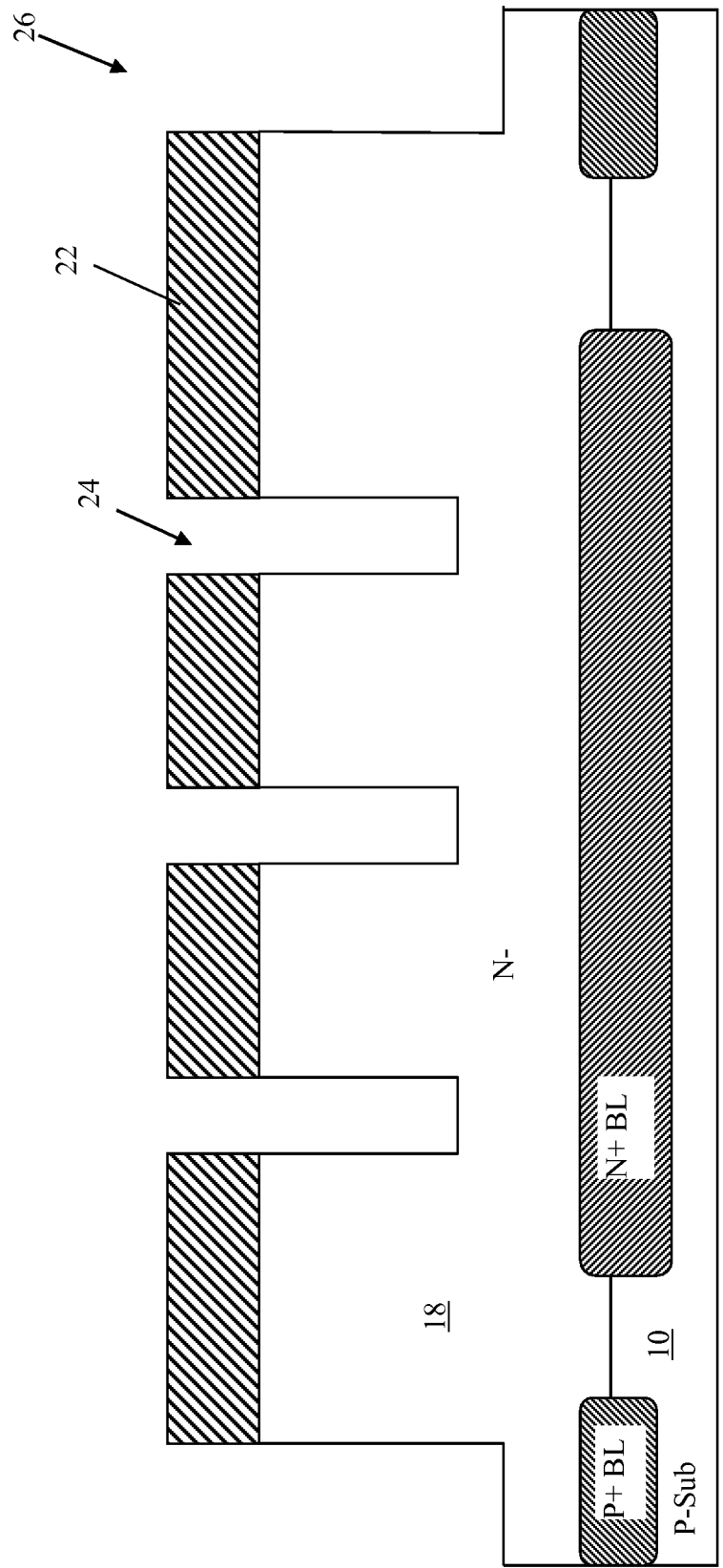

After the N-Epitaxial layer 18 is formed, a thick oxide hard mask 22 is formed on the epitaxial layer and serves as a dielectric layer for electrical insulation. The oxide hard mask 22 is first patterned to define areas where trenches in the epitaxial layer are to be formed. The oxide hard mask 22 is etched down to the substrate surface. Next, a trench etch follows where the exposed substrate is etched to form narrow trenches 24 for forming trench emitters and collectors and wider trenches 26 for forming trench isolation structures, as shown in FIG. 1C. In this manner, a single trench etch step is used to form both emitter/collector trenches and isolation trenches. The trench openings 26 for trench isolation structures are wider and therefore the trenches are etched deeper into the epitaxial layer than the trenches 24. In some embodiments, an optional round hole etch is performed to smooth out the bottom of the trenches.

Figure 1D:
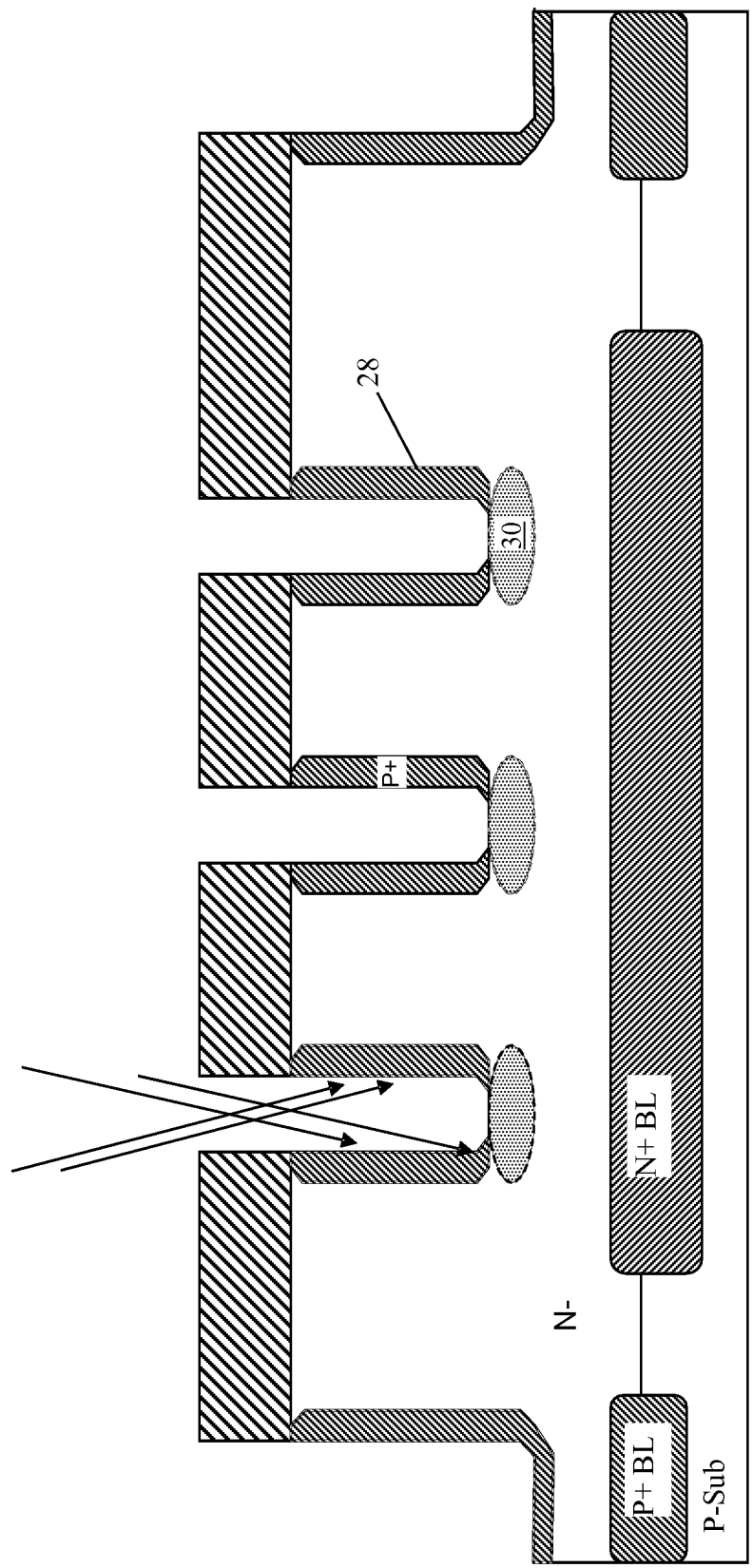

Next, a P-type ion implantation step is carried out to implant P-type dopants on the side walls of the trenches 24 and 26, forming P-type regions 28, as shown in FIG. 1D. In one embodiment, the implantation step performed is a multiple tilt angle implantation with rotation using boron. The P-type ion implantation is performed in such a way that the P-type implant reaches the sidewall and bottom of the trenches 26 for isolation. However, the thickness of the oxide hard mask, the width of the narrow trenches 24 and the tilt angle of the implantation are selected so that bottom portions of the trenches 24 are shielded from any P-type implant. In some embodiments, an optional N-type trench bottom compensation implant is performed to form N+ regions 30 under narrow trenches 24, as shown in FIG. 1D. The compensation implant is optional and may be included when the tilt of the P-type implant is not sufficient to avoid introducing P-type dopants to the bottom of narrow trenches 24.

Figure 1E:
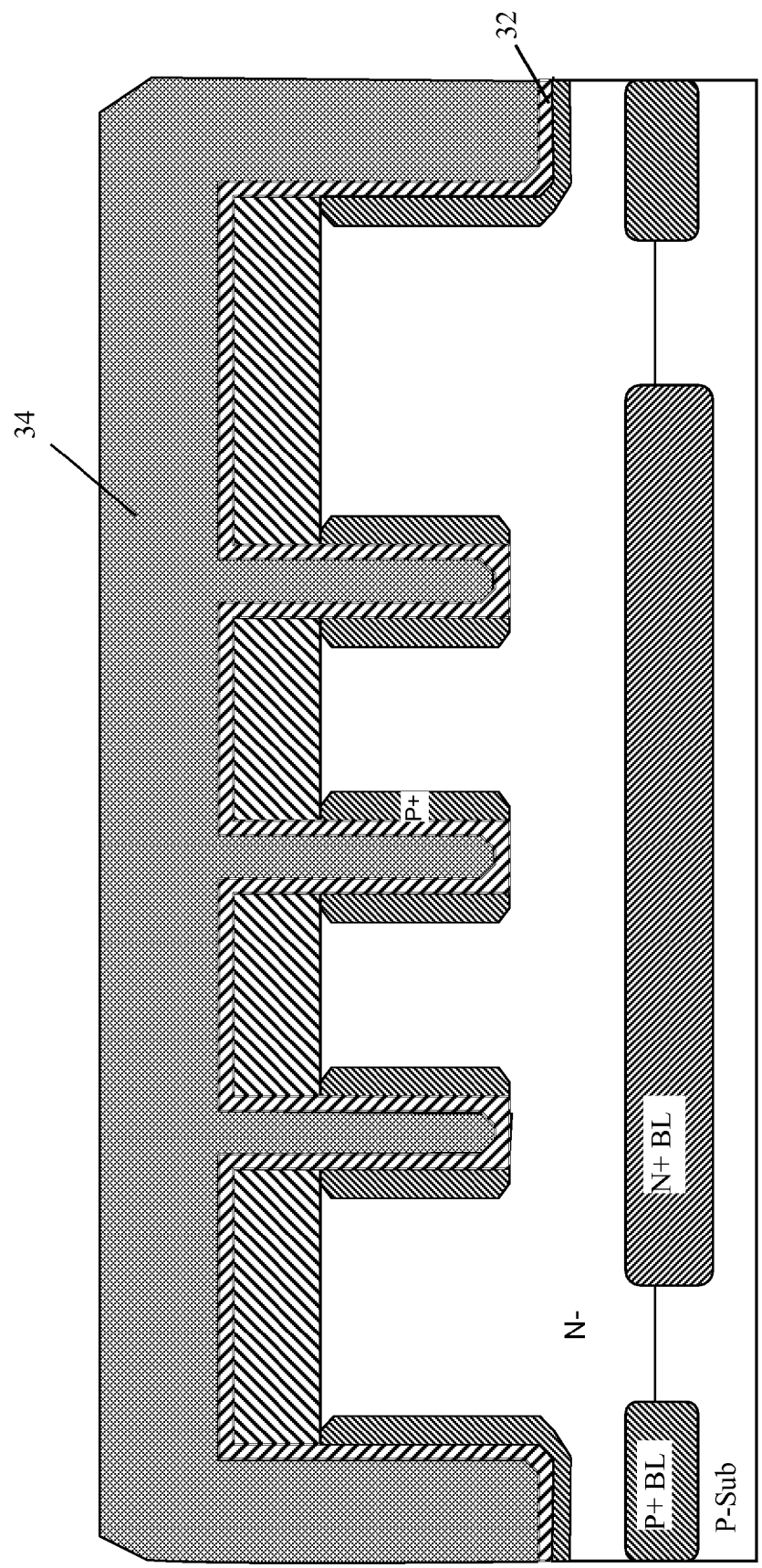

Then, a thin layer of oxide 32 is deposited or thermally grown in the trench openings 24, 26, as shown in FIG. 1E. The oxide layer 32, also referred to as a trench lining oxide, lines both the trench bottom portions and the trench sidewalls. Preferably, the oxide layer 32 has good step coverage to cover conformally the sidewalls and bottom portions of the trenches. In one embodiment, the oxide layer 32 is a layer of high temperature thermal oxide (HTO). Then, a polysilicon layer 34 is deposited, filling the trenches 24, 26 and forming a polysilicon layer above the surface of the trench lining oxide 32 and the oxide hard mask 22, as shown in FIG. 1E. In some embodiments, a P+ doping step is carried out to dope the deposited polysilicon layer.

Figure 1F:
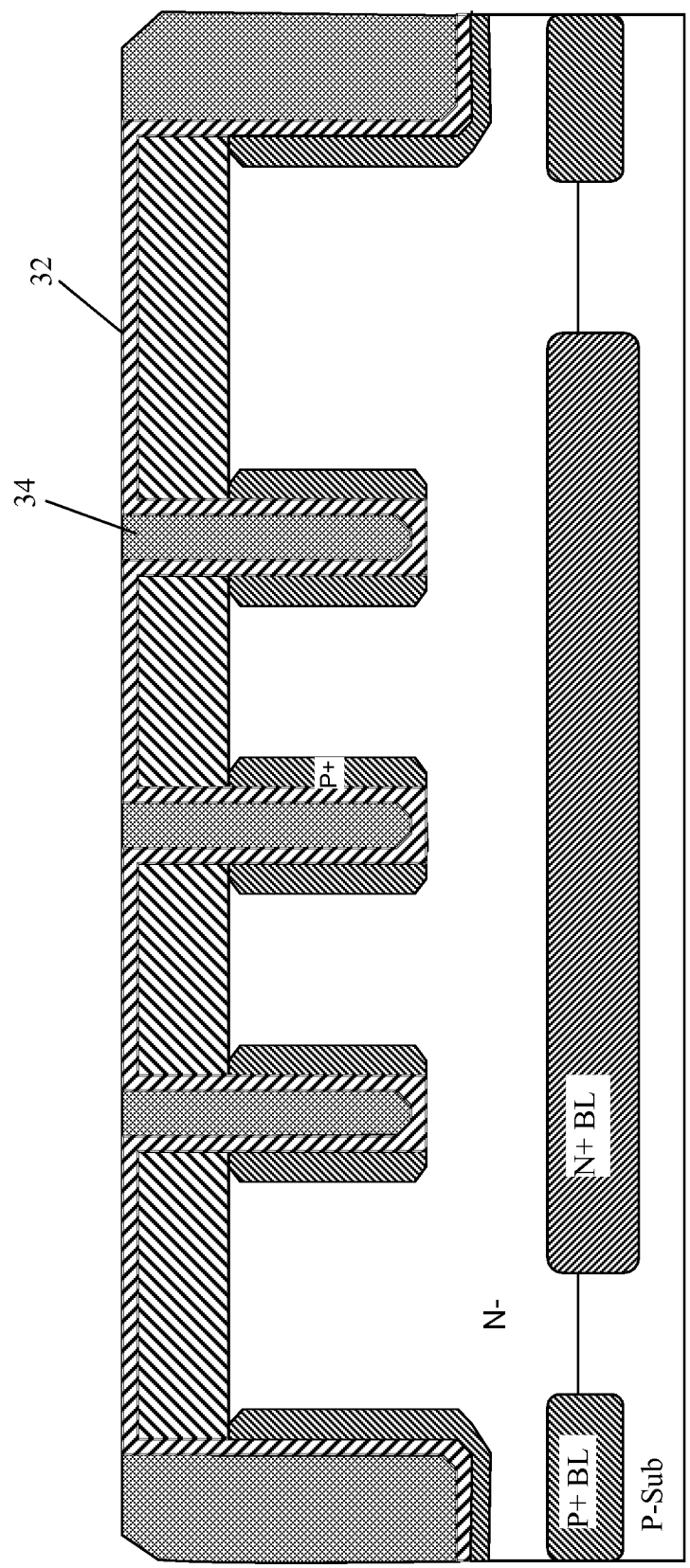
Figure 1G:
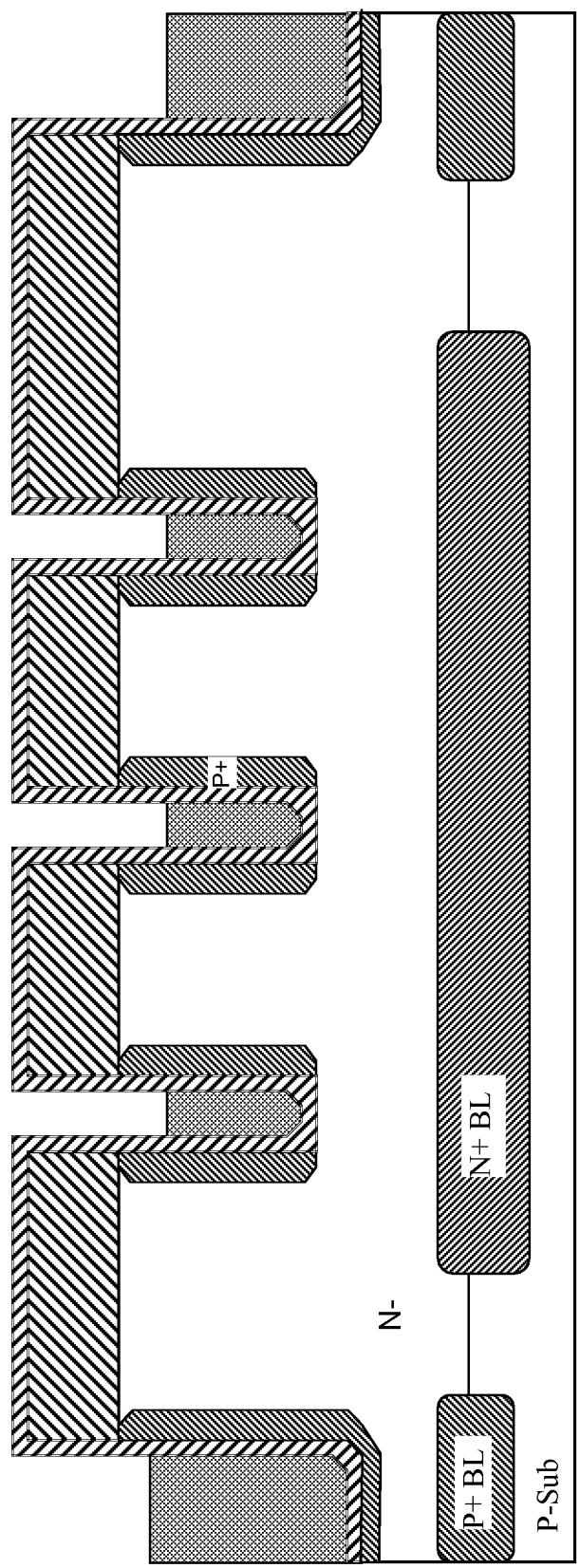
Figure 1H:
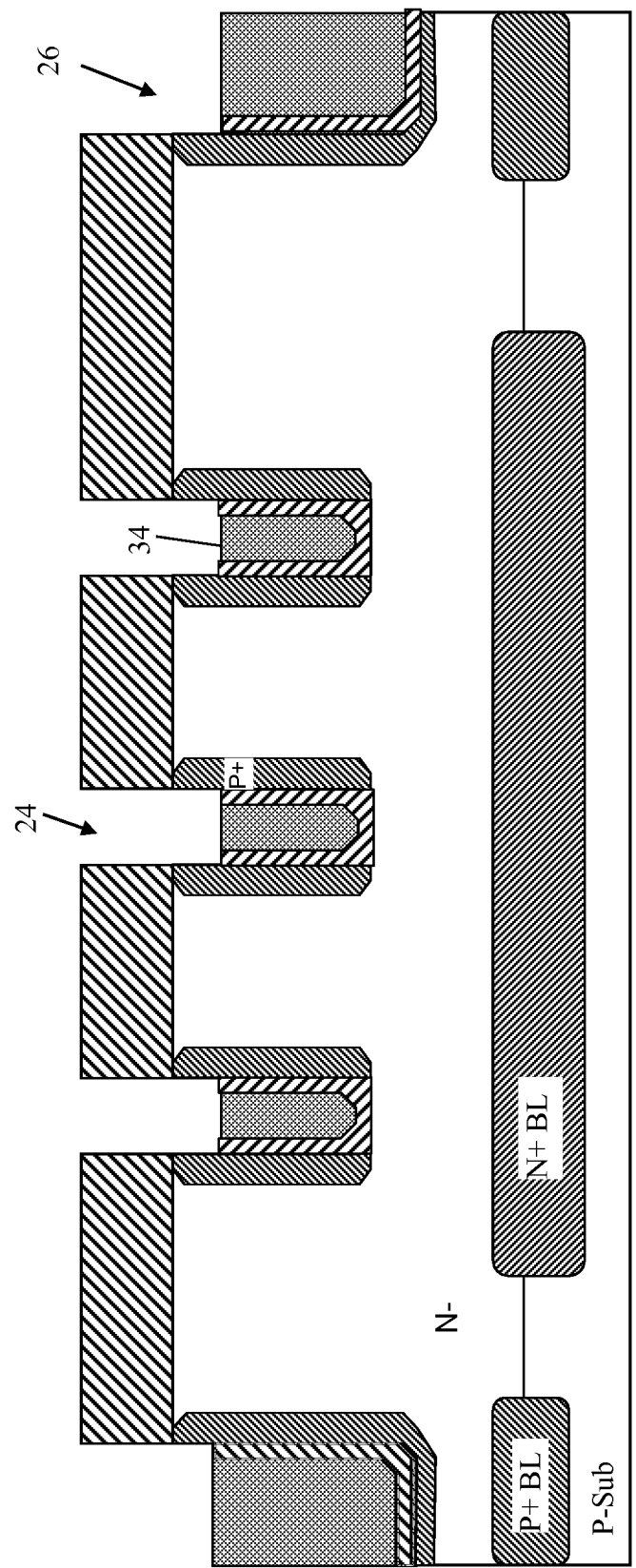

The polysilicon layer 34 is first etched back to the top of the trench lining oxide 32 on top of the oxide hard mask 22, as shown in FIG. 1F. Then, the polysilicon layer 34 is further over-etched to recess the polysilicon layer below the surface of the silicon surface, that is, below the top surface of the N-Epitaxial layer 18, as shown in FIG. 1G. Subsequently, an isotropic oxide etch is performed to remove the exposed trench lining oxide 32, as shown in FIG. 1H. The trenches 24, 26 are thus filled partially with polysilicon 34 which is insulated from the N-Epitaxial layer by the trench lining oxide 32 which serves as a dielectric layer. The height of the polysilicon 34 and the trench lining oxide 32 in the trenches can vary as long as the polysilicon 34 and the trench lining oxide 32 fill only a portion of the trenches. The exact height of the polysilicon/trench lining oxide layer is not critical to the practice of the present invention as long as sufficient amount of exposed silicon is left on the sidewalls of the narrow trenches 24 to allow for the formation of electrical contacts to the P+ regions 28. More specifically, the remaining portions of trench lining oxide 32 in the bottom portions of the trenches 24 provide electrical insulation at the trench bottom to block off conduction at the trench bottom regions.

Figure 1I:
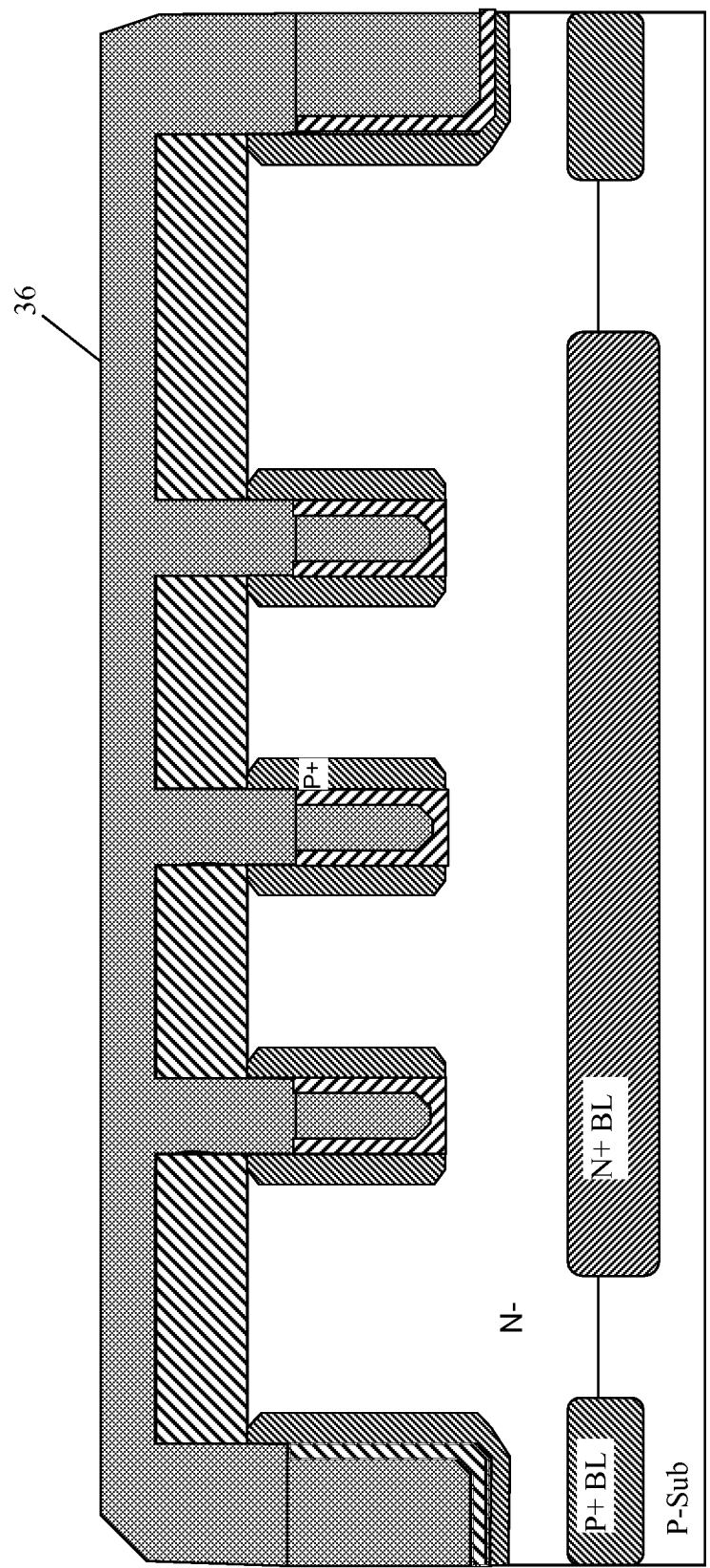
Figure 1J:
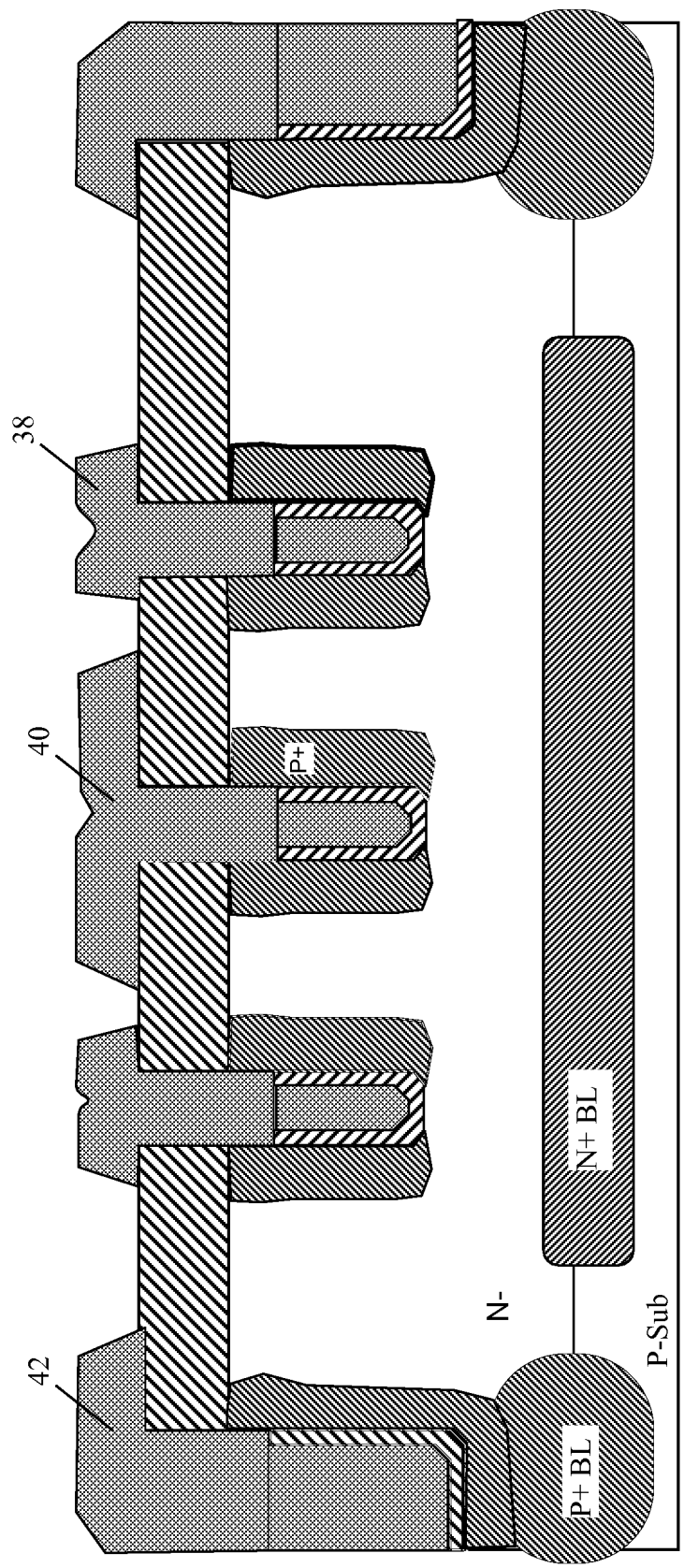

Another polysilicon layer 36 is deposited, filling the remaining portions of trenches 24, 26 and forming a polysilicon layer above the surface of the oxide hard mask 22, as shown in FIG. 1I. The polysilicon layer 36 is doped with P-type dopants to form a heavily doped P+ polysilicon layer. Then, the polysilicon layer 36 is patterned to form a collector interconnect ring 38 and an emitter field plate 40, as shown in FIG. 1J. At this time, the implanted dopants of P+ regions 28 around the sidewall of the trenches 24 are diffused to form P+ diffusion region 28a and P+ diffusion region 28b. Implanted dopants of P+ regions at the sidewall of the isolation trenches 26 and P+ buried layer 14 are also diffused and vertically overlap each other, thus forming the isolation structure 45 as shown in FIG. 1J. The polysilicon layer 36 is further patterned to form an isolation structure field plate 42. Then, the lateral PNP bipolar transistor can be completed by forming metal interconnects over a dielectric layer, as shown in FIG. 1K.

Figure 1K:
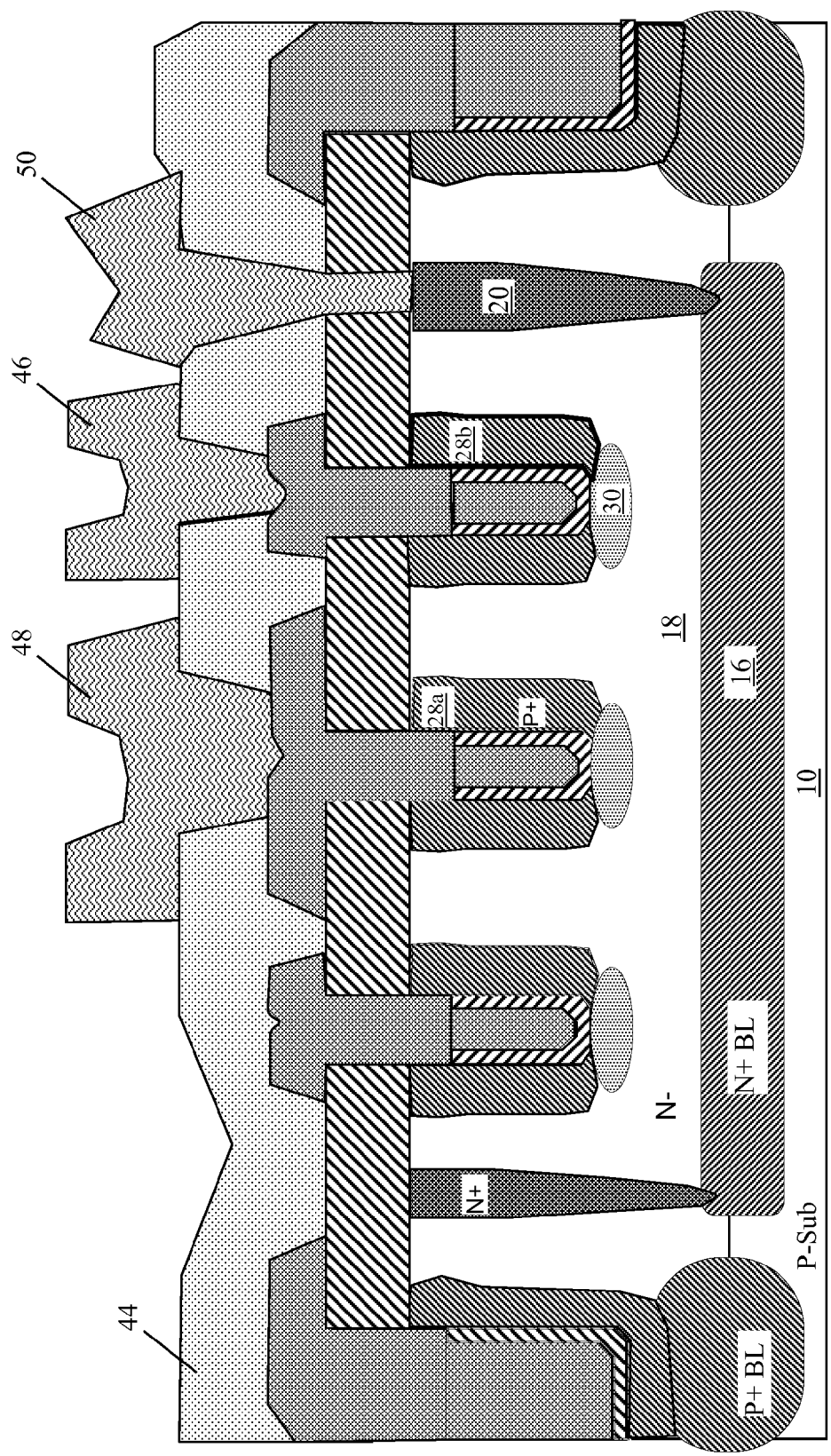

FIG. 1K illustrates one embodiment of a completed lateral PNP bipolar transistor formed using the fabrication process described above including the optional N+ sinkers 20. Metal contacts to the emitter, collector and base terminals of the PNP transistor are formed over contact openings in a dielectric layer 44, such as a BPSG layer. More specifically, a collector contact 46 is formed making electrical contact to the collector interconnector ring 38, an emitter contact 48 is formed making electrical contact to the emitter field plate 40, and a base contact 50 is formed making electrical contact to the N+ sinker 20. In this manner, a lateral PNP bipolar transistor is formed with the Emitter formed in P+ diffusion region 28a, the Collector formed in P+ diffusion region 28b, and the Base formed in the N-Epitaxial layer 18. In the present embodiment, the Collector is formed as a ring structure surrounding the Emitter. The Base is the distance between the P+ diffusion region 28a and P+ diffusion region 28b.

N+ sinkers 20 electrically contacting the N+ buried layer has the effect of reducing the base resistance and there by disabling the vertical parasitic PNP transistor that is formed by the P+ Emitter, the N-Epitaxial Base and the P-substrate 10. The lateral PNP transistor thus formed is more robust and is immune to undesired parasitic substrate conduction. Furthermore, the emitter field plate 40 overlying the base region acts as an electrostatic shield for the base region and has the effect of increasing the current gain of the transistor. More specifically, the emitter field plate has the function of shielding the base region from electrostatic build-up in the overlying oxide layer, where such electrostatic build-up is known to result in excessive leakage, degradation in breakdown voltage and reduction in current gain. The lateral PNP bipolar transistor as thus constructed is robust while realizing high performance.

Figure 2:
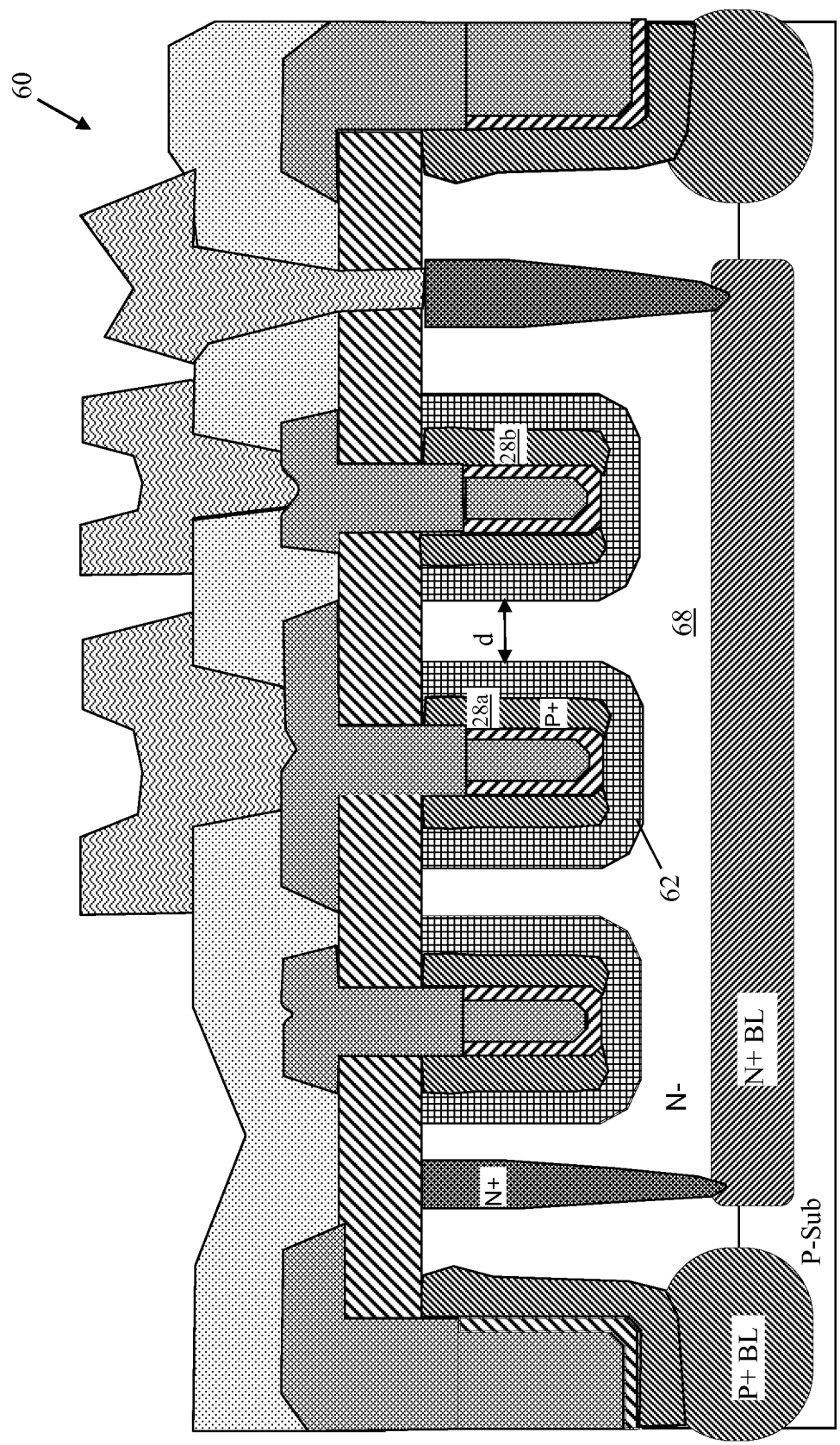
FIG. 2 is a cross-sectional view of a lateral PNP bipolar transistor according to a first alternate embodiment of the present invention.

FIG. 2 illustrates an alternate embodiment of a lateral PNP bipolar transistor formed in the same manner as the lateral PNP transistor in FIG. 1K but with the addition of laterally diffused base regions surrounding the emitter and collector diffusion regions. Referring to FIG. 2, a lateral PNP transistor 60 is formed using substantially the same fabrication process described above with reference to FIGS. 1A to 1K. However, lateral PNP transistor 60 is formed using an N-Epitaxial layer 68 having a lower doping level than the standard base doping level. That is, the doping level for N-Epitaxial layer 68 is lower than the doping level used in N-Epitaxial layer 18 in the above-embodiment. Then, before the P+ regions 28 are implanted, an additional N-Base implantation step is carried out to form N-Base regions 62 around all the trenches. The N-Base implants do not need to be blocked from the bottom of the narrow trenches, as in the case of the P+ implants. After the drive-in step, N-Base regions 62 are formed around all the trenches. N-Base regions 62 have a doping level higher than the doping level of the N-Epitaxial layer 68. Although the N-Base implants are also introduced to the wide trenches where the isolation structures are to be formed, the subsequent P+ implants and drive-in and also the heavily doped P+ buried layer will overcome the N-Base implants. Therefore, introducing the N-Base implants to the isolation trenches does not cause an impact and no masking step is necessary for the N-Base implantation. After the N-Base implantation and drive-in, the P+ implantation step and subsequent processing steps can be carried out as described above with reference to FIGS. 1A to 1K. As thus constructed, lateral PNP transistor 60 includes a laterally diffused narrow base to achieve even higher performance.

Figure 3:
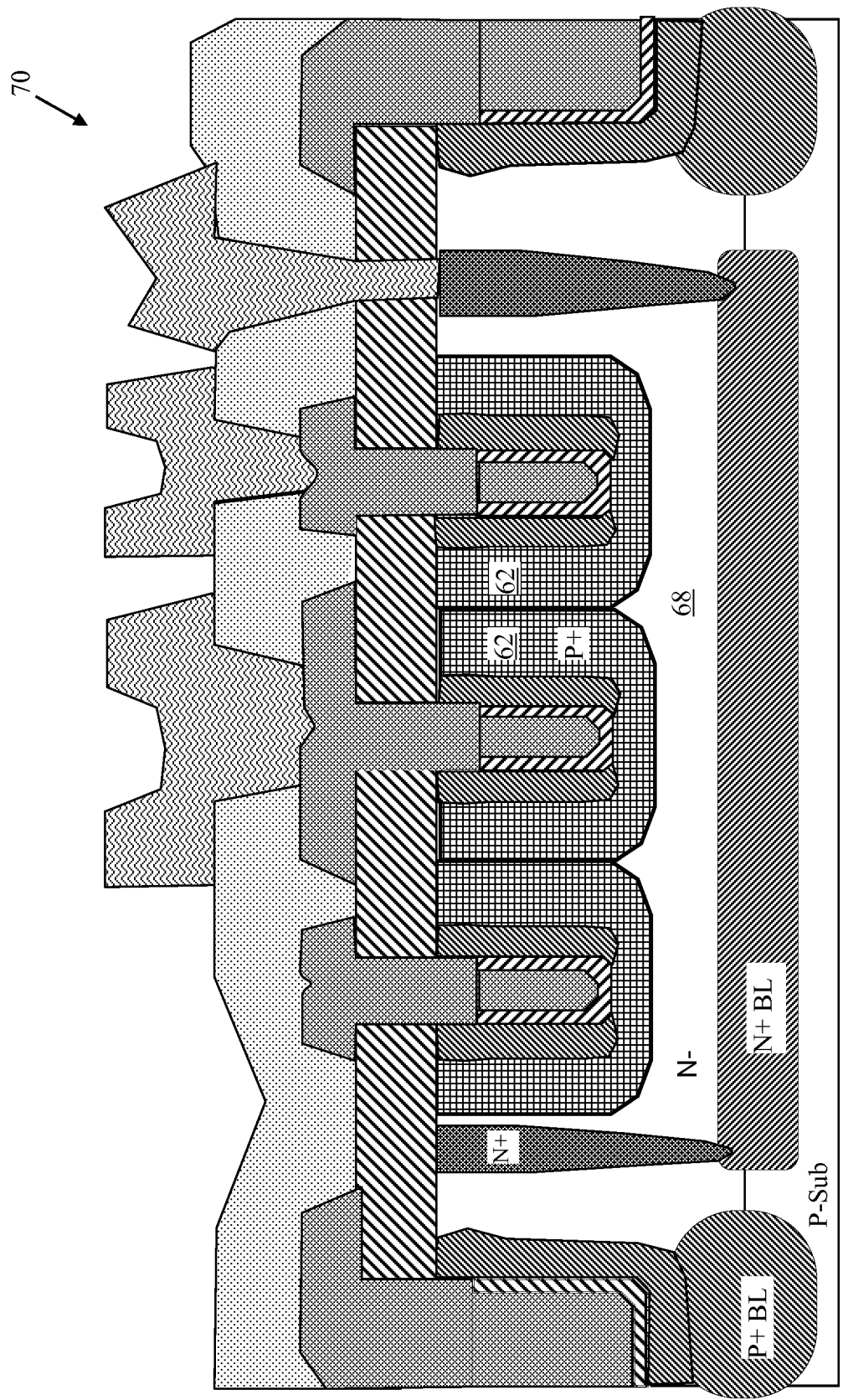
FIG. 3 is a cross-sectional view of a lateral PNP bipolar transistor according to a second alternate embodiment of the present invention.

In lateral PNP transistor 60, the Base includes part of the N-Epitaxial layer 68, denoted by a distance "d", between two adjacent N-Base regions 62. In this case, a given pitch size between the narrow trenches are used so as to leave the N-Epitaxial layer between the N-Base regions. In an alternate embodiment shown in FIG. 3, a smaller pitch between the narrow trenches can be used so that the N-Base regions 62 abut each other, with no N-Epitaxial layer left in the Base of the lateral PNP transistor. The lateral PNP transistor 70 thus constructed achieves high performance with a laterally diffused narrow base.

Alternate Embodiment

Nitride Mask

In the above-described embodiment, an oxide hardmask is formed over the epitaxial layer and masked for trench formation. The oxide hardmask is left on the epitaxial layer for the remainder of the fabrication process and functions as an insulating layer for the epitaxial layer. According to an alternate embodiment of the present invention, a nitride mask is used and the oxide hardmask is removed prior to the lining oxide formation. FIGS. 4A to 4H are cross-sectional views illustrating the process step for fabricating a lateral PNP bipolar transistor according to alternate embodiments of the present invention.

Figure 4A:
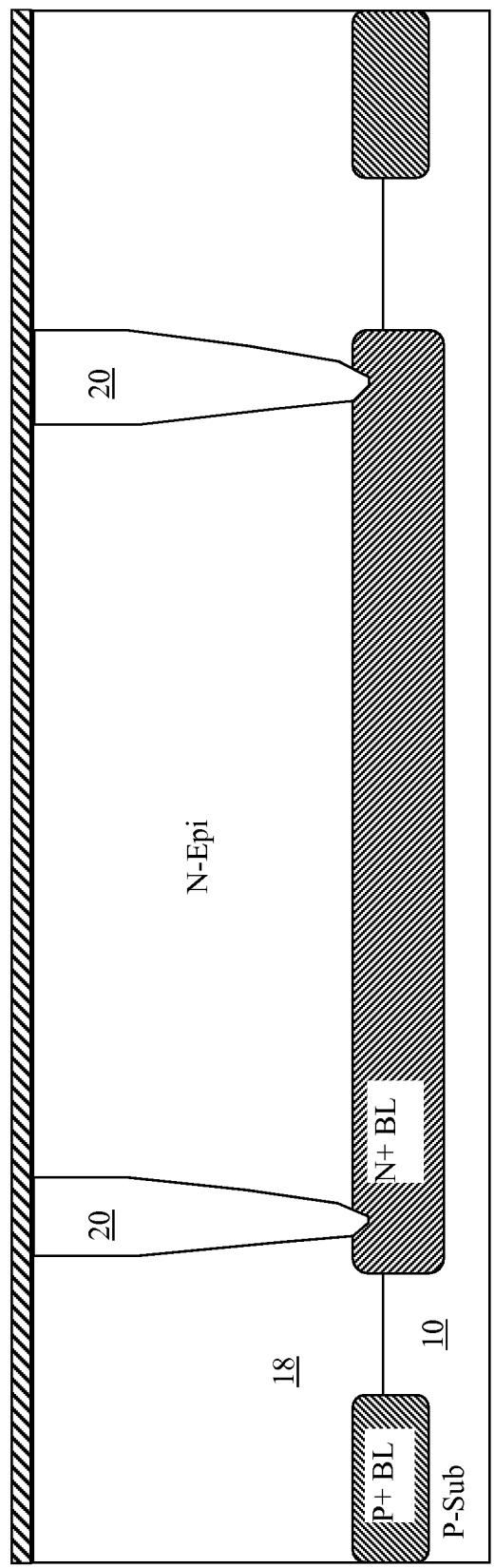
FIGS. 4A to 4H are cross-sectional views illustrating the process step for fabricating a lateral PNP bipolar transistor according to a third embodiment of the present invention.

Referring to FIGS. 4A to 4H, the lateral PNP transistor is formed on a P-type silicon substrate 10 with an N-type Epitaxial layer 18 formed thereon. P+ buried layer 14 and the N+ buried layer 16 are formed on the substrate using separate masking and ion implantation steps. One or more anneals can be performed to drive in the implanted dopants, thereby forming the buried layers between the substrate and the epitaxial layer as shown in FIG. 4A. In some embodiments, a buffer oxide or pad oxide is formed and optional N+ sinker implantation steps may be carried out to form N+ sinkers to the N+ buried layer.

Figure 4B:
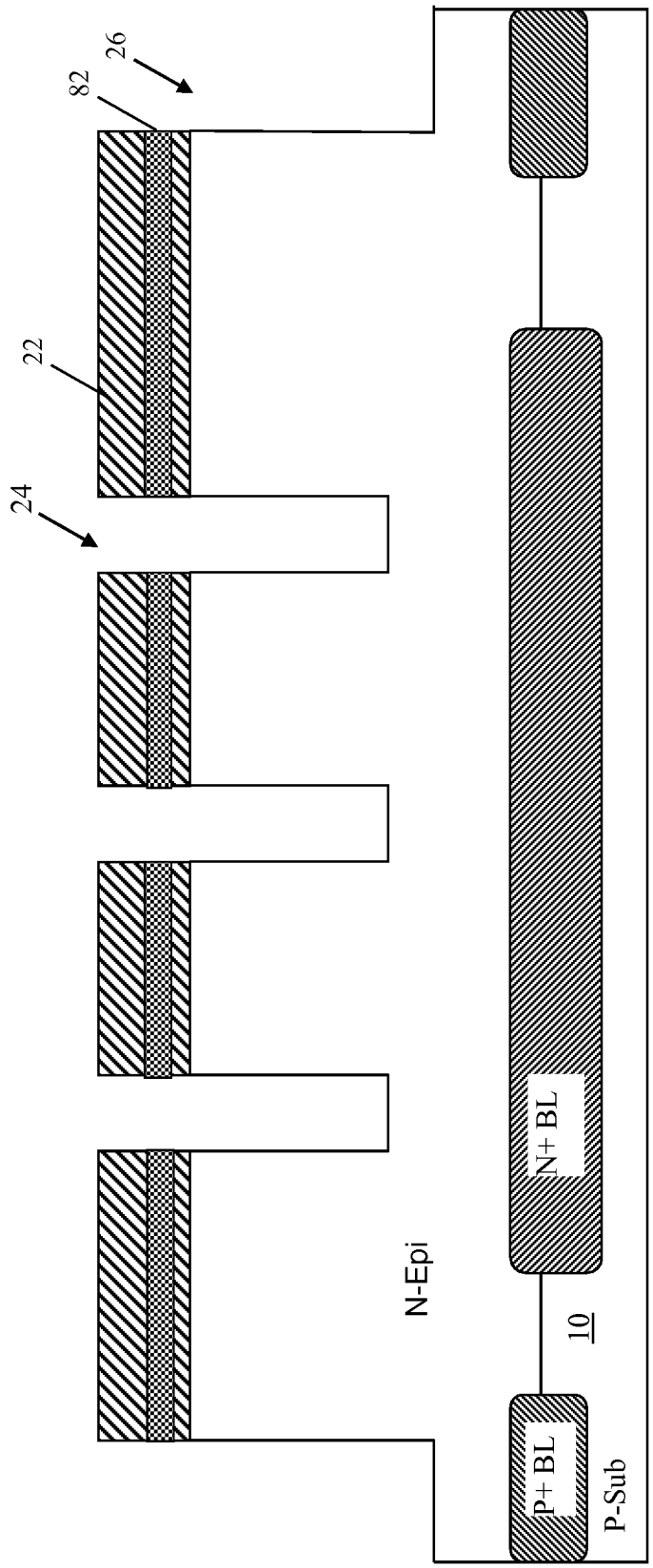

After the N-Epitaxial layer 18 is formed, a nitride layer 82 is deposited on the buffer oxide of the epitaxial layer. Then, a thick oxide hardmask 22 is formed on the nitride layer. The oxide hardmask 22 and the nitride layer 82 are first patterned to define areas where trenches in the epitaxial layer are to be formed. The oxide hardmask 22, the nitride layer 82 and the pad oxide are etched down to the silicon surface of the epitaxial layer. Next, a trench etch follows where the exposed silicon is etched to form narrow trenches 24 for forming trench emitters and collectors and wider trenches 26 for forming trench isolation structures, as shown in FIG. 4B.

Figure 4C:
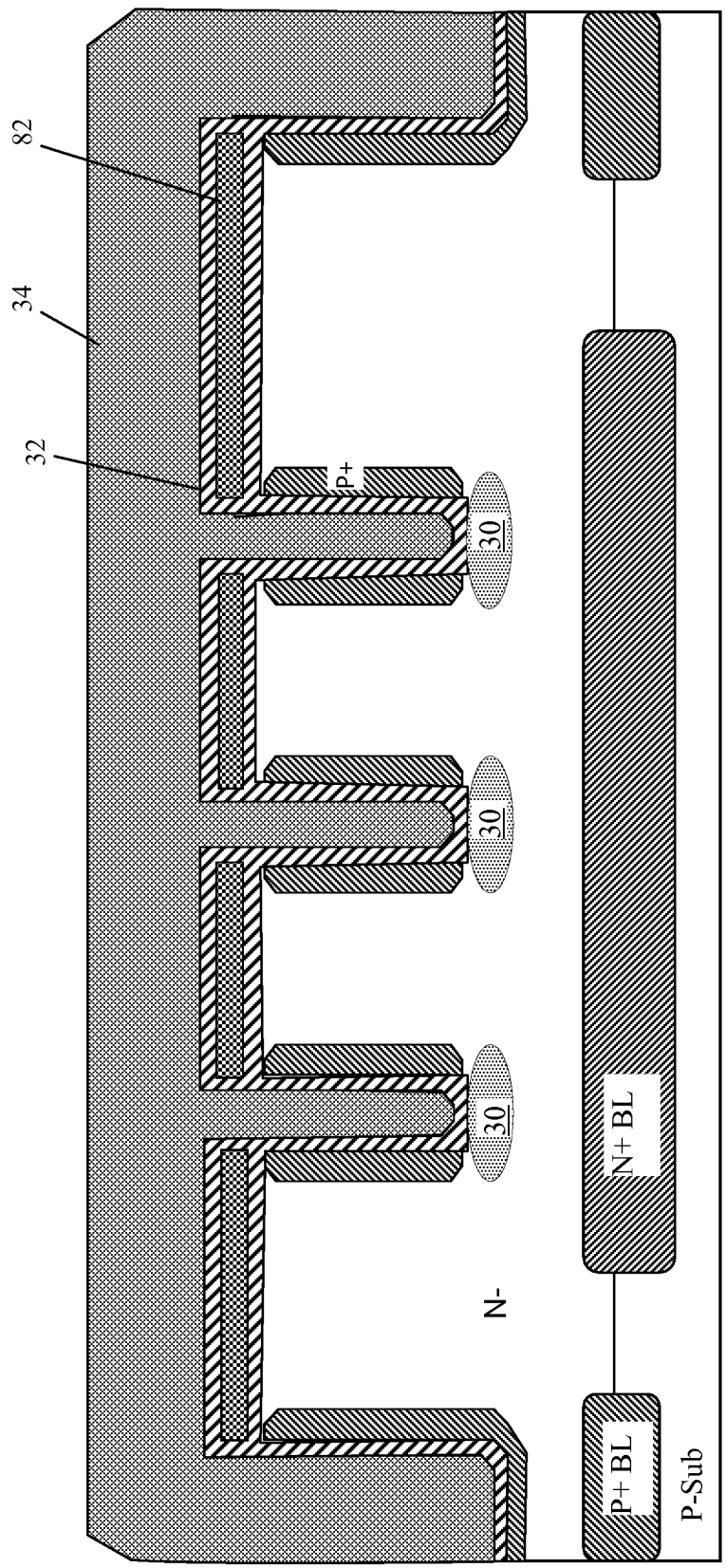

Next, a P-type ion implantation step is carried out to implant P-type dopants on the side walls of the trenches 24 and 26, forming P-type regions 28, as shown in FIG. 4C. In one embodiment, the implantation step performed is a multiple tilt implantation with rotation using boron. The P-type ion implantation is performed in such a way that the P-type implant reaches the sidewalls of trenches 24 and the sidewalls and bottoms of the trenches 26. In some embodiments, an optional N-type trench bottom compensation implant is performed to form N+ regions 30 under narrow trenches 24.

Then, the oxide hardmask 22 is removed, leaving the nitride layer 82. A thin layer of oxide 32 is deposited or thermally grown in the trench openings 24, 26, as shown in FIG. 4C. The oxide layer 32, also referred to as a trench lining oxide, lines both the trench bottom portions and the trench sidewalls. In one embodiment, the oxide layer 32 is a layer of high temperature thermal oxide (HTO). Then, a polysilicon layer 34 is deposited, filling the trenches 24, 26 and forming a polysilicon layer above the surface of the trench lining oxide 32 and the nitride layer 82, as shown in FIG. 4C. In some embodiments, a P+ doping step is carried out to dope the deposited polysilicon layer.

Figure 4D:
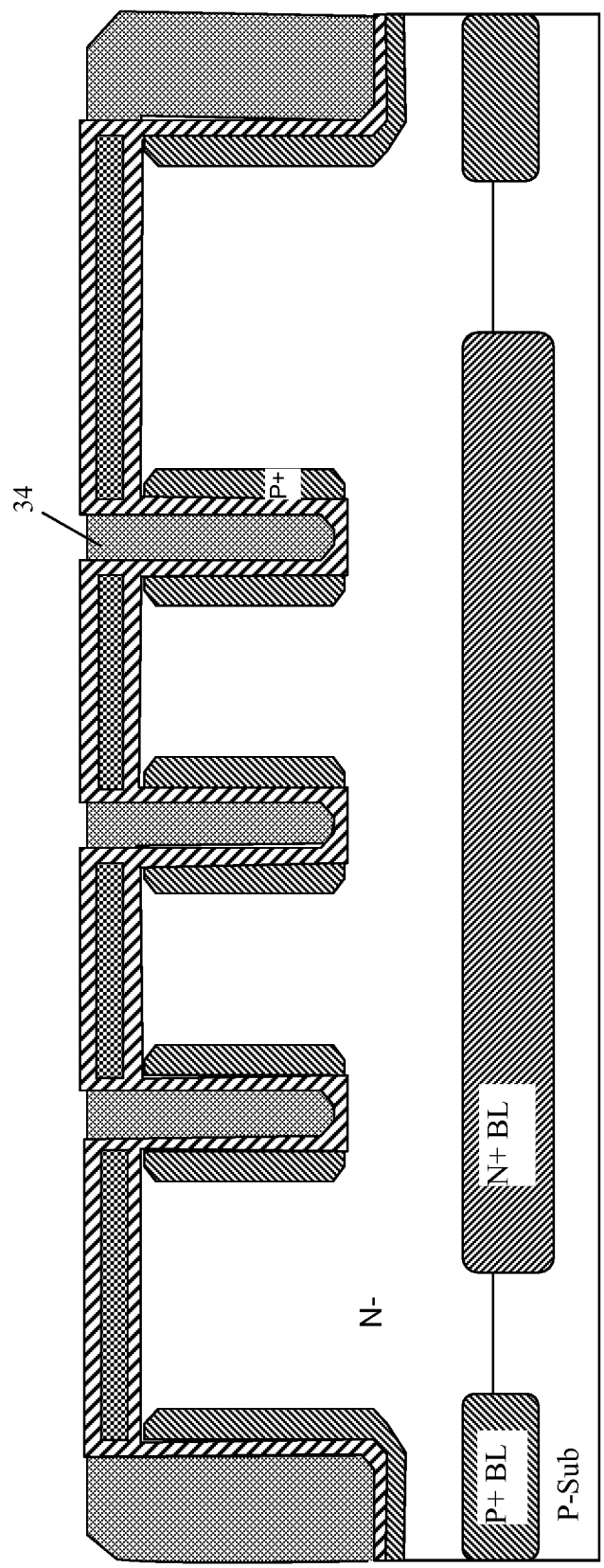
Figure 4E:
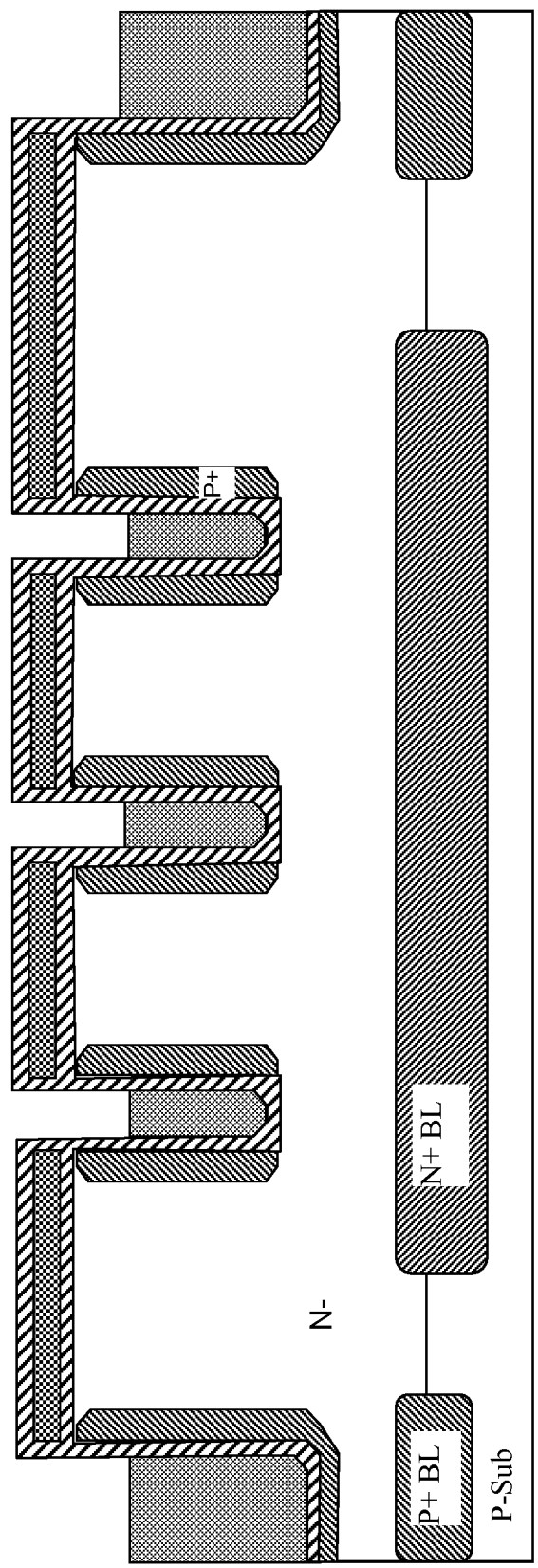
Figure 4F:
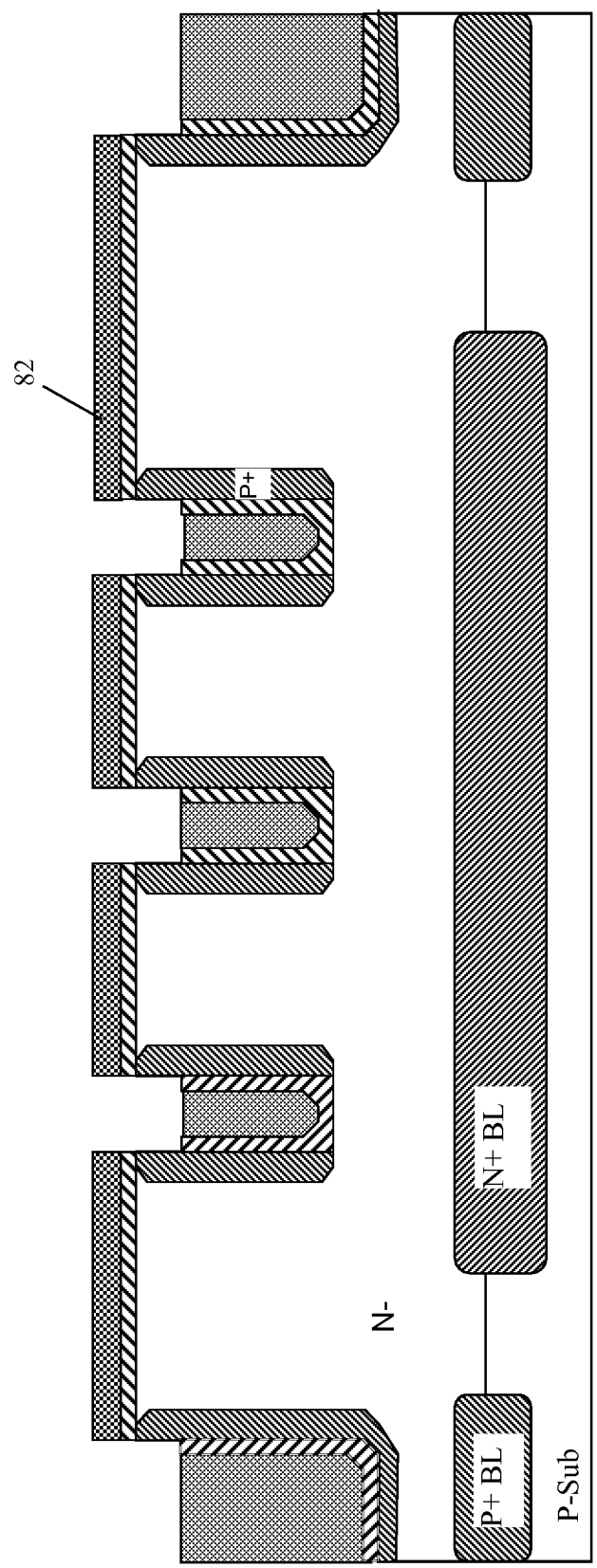

The polysilicon layer 34 is first etched back to the top of the trench lining oxide 32 on top of the nitride layer 82, as shown in FIG. 4D. Then, the polysilicon layer 34 is further over-etched to recess the polysilicon layer below the surface of the silicon surface, that is, below the top surface of the N-Epitaxial layer 18, as shown in FIG. 4E. Subsequently, an isotropic oxide etch is performed to remove the exposed trench lining oxide 32, as shown in FIG. 4F. The nitride layer 82 is exposed and the trenches 24, 26 are filled partially with polysilicon 34 which is insulated from the N-Epitaxial layer by the trench lining oxide 32.

Figure 4G:
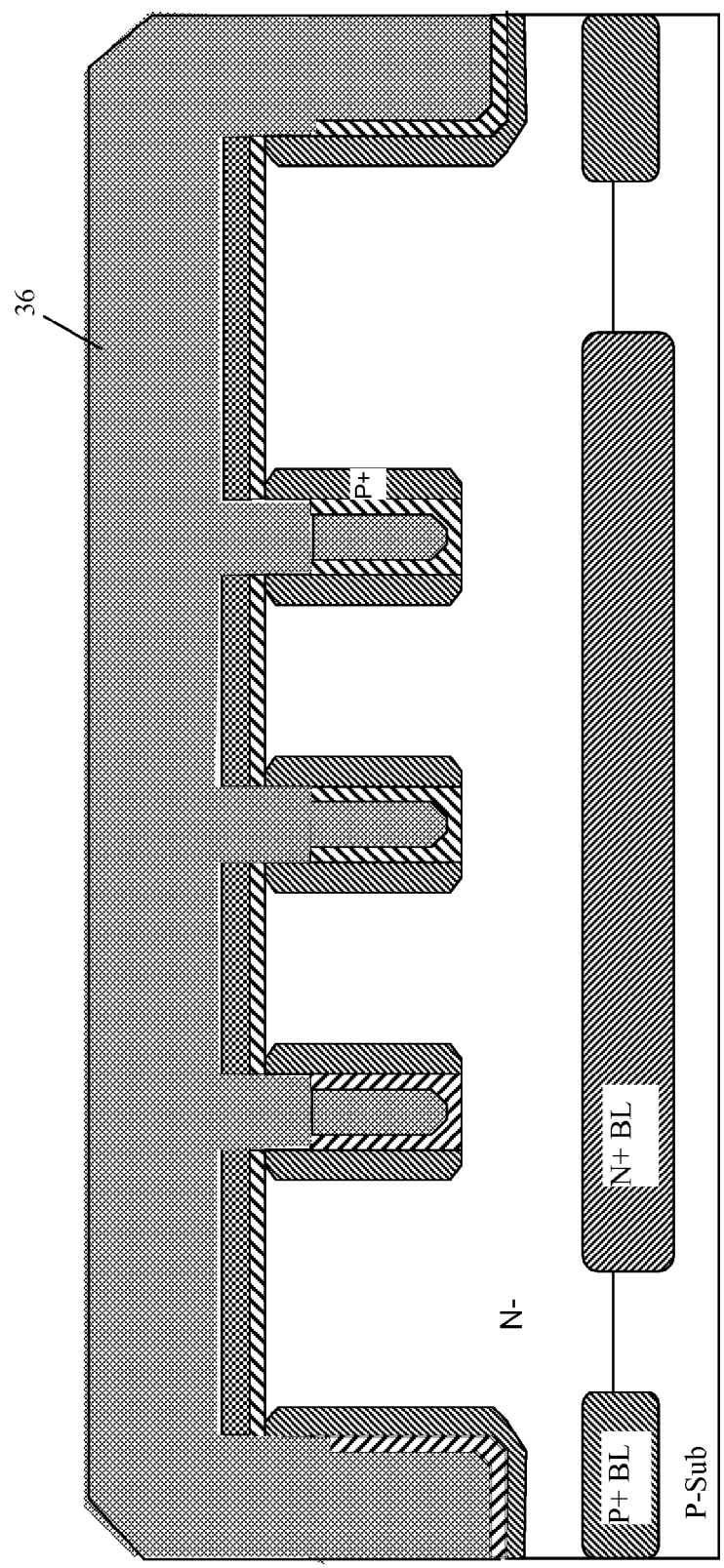
Figure 4H:
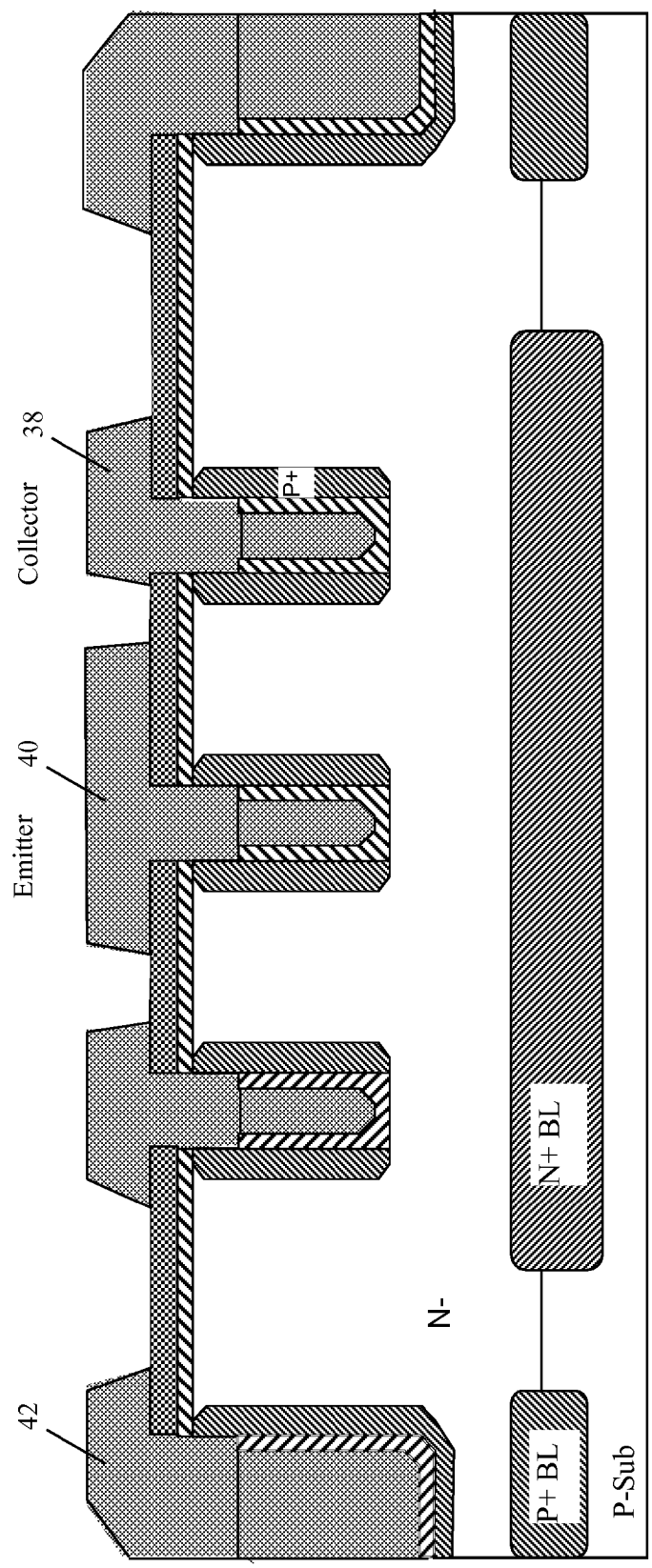

Another polysilicon layer 36 is deposited, filling the remaining portions of trenches 24, 26 and forming a polysilicon layer above the surface of the nitride layer 82, as shown in FIG. 4G. The polysilicon layer 36 is doped with P-type dopants to form a heavily doped P+ polysilicon layer. Then, the polysilicon layer 36 is patterned to form a collector interconnect ring 38 and an emitter field plate 40, as shown in FIG. 4H. The polysilicon layer 36 is further patterned to form an isolation structure field plate 42. Then, the lateral PNP bipolar transistor can be completed by forming metal interconnects over a dielectric layer, in the same manner as shown above with reference to FIG. 1K. In the fabrication process of FIGS. 4A to 4H, the oxide hardmask is removed after trench formation and P+ ion implantation, leaving only the nitride layer to cap the epitaxial layer. The lateral PNP transistor thus formed is capable of high performance.

(2) Lateral PNP Using Isolation Structures for Trench Emitter and Collector and P+ Auto-Doping in Trenches In a second embodiment of the present invention, the trench emitter and trench collector are formed by filling trenches formed in a semiconductor layer with heavily doped polysilicon layer and auto-doping the trench sidewalls by out-diffusion of dopants from the doped polysilicon filler. An oxide layer is formed on the bottom portion of the trenches prior to polysilicon deposition. The oxide layer provides insulation and prevents emitter to base breakdown at the bottom corners of the trenches.

Figure 5A:
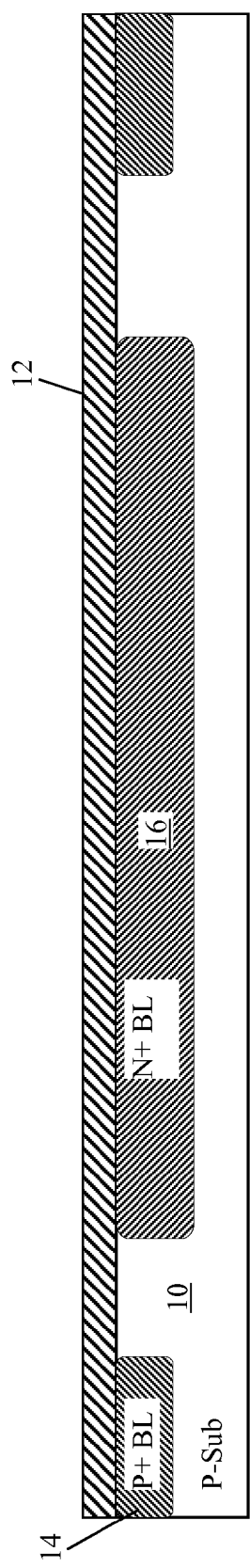
FIGS. 5A-5J are cross-sectional views illustrating the process step for fabricating a lateral PNP bipolar transistor according to alternate embodiments of the present invention.

The fabrication process and the structure of the lateral PNP transistor of the present invention will now be described with reference to FIGS. 5A to 5J. Referring to FIGS. 5A to 5J, the lateral PNP transistor is formed on a P-type silicon substrate 10. A buffer oxide layer 12 may be formed on the top surface of the substrate 10 before the ion implantation steps that follow to form P+ buried layer 14 and N+ buried layer 16. The P+ buried layer 14 and the N+ buried layer 16 are formed using separate masking and ion implantation steps. One or more anneals can be performed to drive in the implanted dopants, thereby forming the buried layers as shown in FIG. 5A.

Figure 5B:
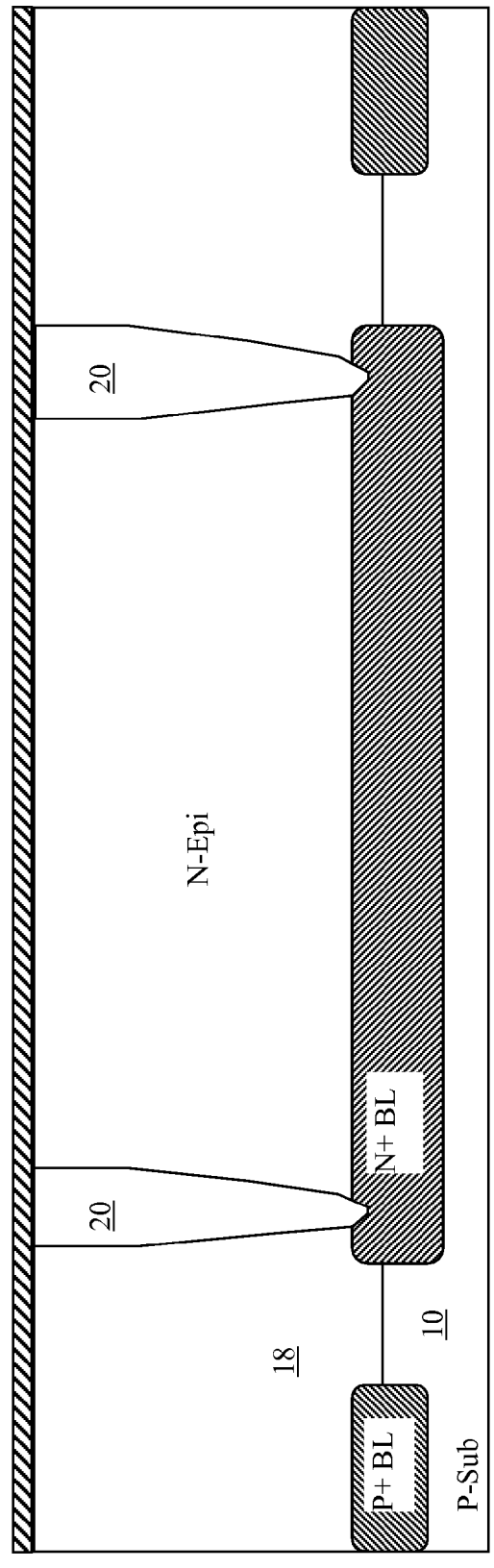

The buffer oxide layer 12 is then removed and an N-type Epitaxial layer 18 is formed on the substrate 10, as shown in FIG. 5B. In some embodiments, a buffer oxide is formed and then a masking and high dose phosphorus ion implantation step is performed to form N+ sinkers 20 which are heavily doped N-type regions for contacting the N+ buried layer. N+ sinkers 20 are optional and may be omitted in some embodiments of the present invention. In an alternate embodiment, N-type Epitaxial layer 18 is doped to a dopant level typically used for N-wells.

Figure 5C:
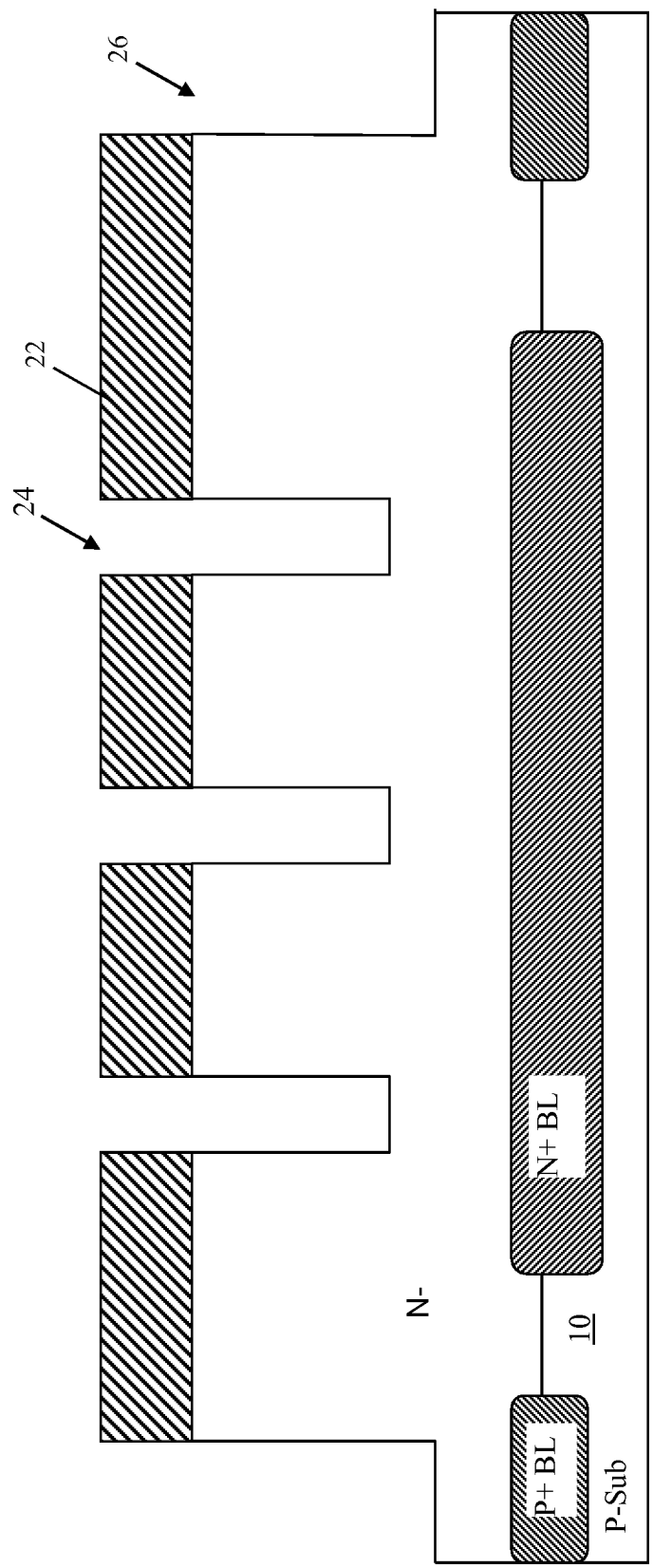

After the N-Epitaxial layer 18 is formed, a thick oxide hard mask 22 is formed on the epitaxial layer. The oxide hard mask 22 is first patterned to define areas where trenches in the epitaxial layer are to be formed. The oxide hard mask 22 is etched down to the substrate surface. Next, a trench etch follows where the exposed substrate is etched to form narrow trenches 24 for forming trench emitters and collectors and wider trenches 26 for forming trench isolation structures, as shown in FIG. 5C. In this manner, a single trench etch step is used to form both emitter/collector trenches and isolation trenches. The trench openings 26 for trench isolation structures are wider and therefore the trenches are etched deeper into the epitaxial layer than the trenches 24. In some embodiments, an optional round hole etch is performed to smooth out the bottom of the trenches.

Figure 5D:
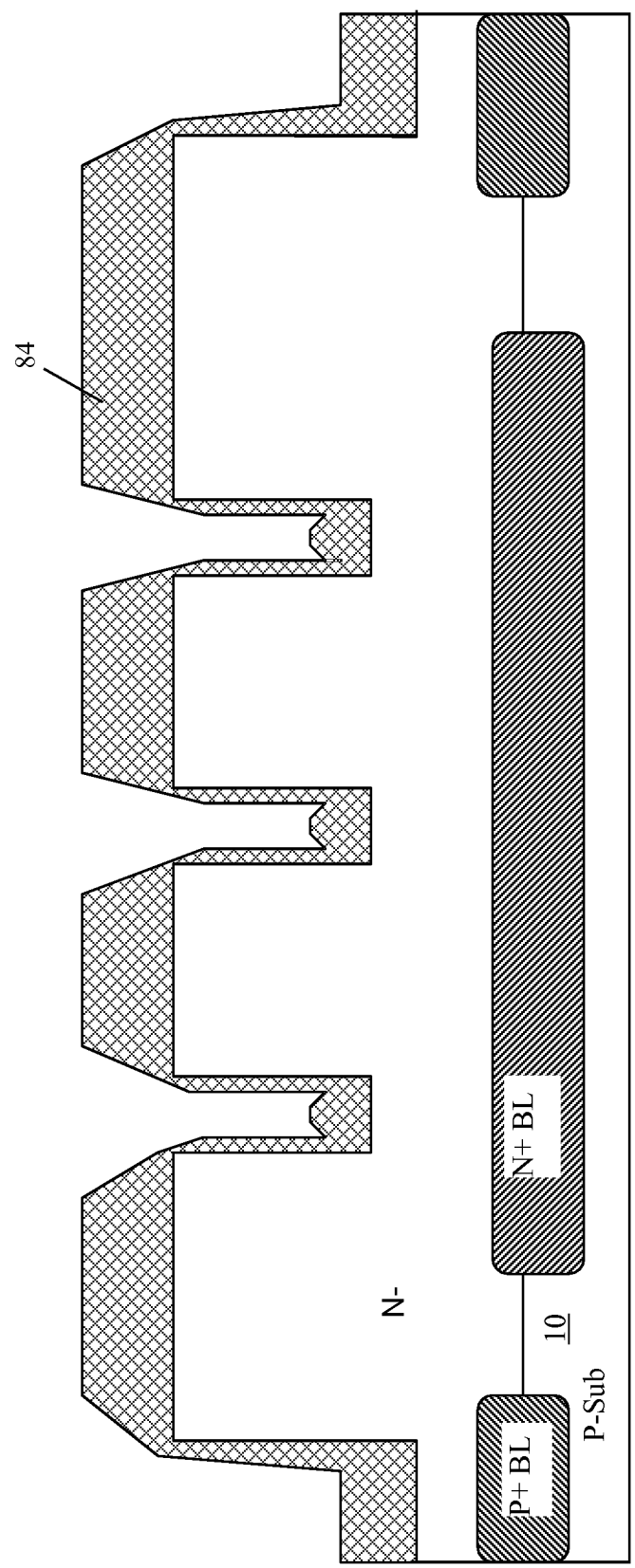

Next, the oxide hardmask 22 is removed and a second oxide layer 84 is deposited on the silicon surfaces. That is, the top of the epitaxial layer and the sidewalls and bottom portions of the trenches are all covered with the second oxide layer 84, as shown in FIG. 5D. In one embodiment, the second oxide layer 84 is a high density plasma (HDP) oxide. HDP oxide is deposited in such a way that a thick oxide layer results in the bottom portions of the trenches and on top of the epitaxial layer while a thin oxide layer results along the sidewalls of the trenches. A densification step may then follow to densify the HDP oxide.

Figure 5E:
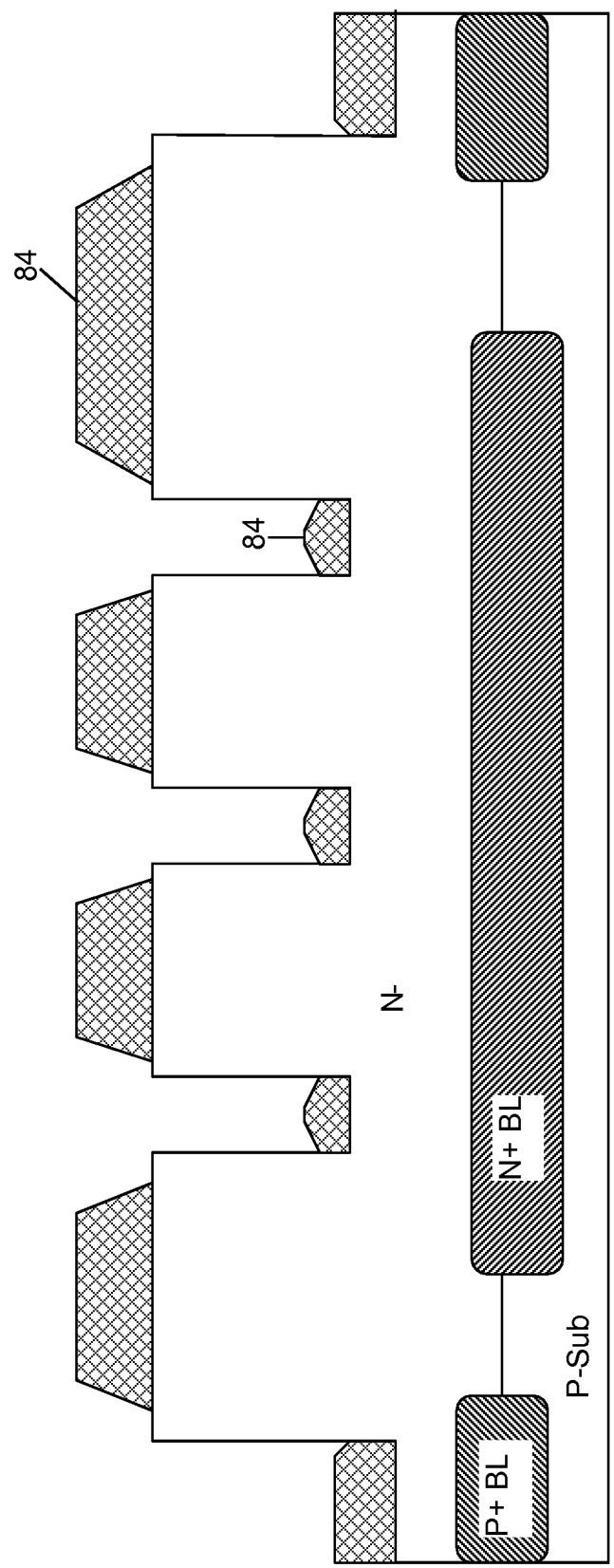
Figure 5F:
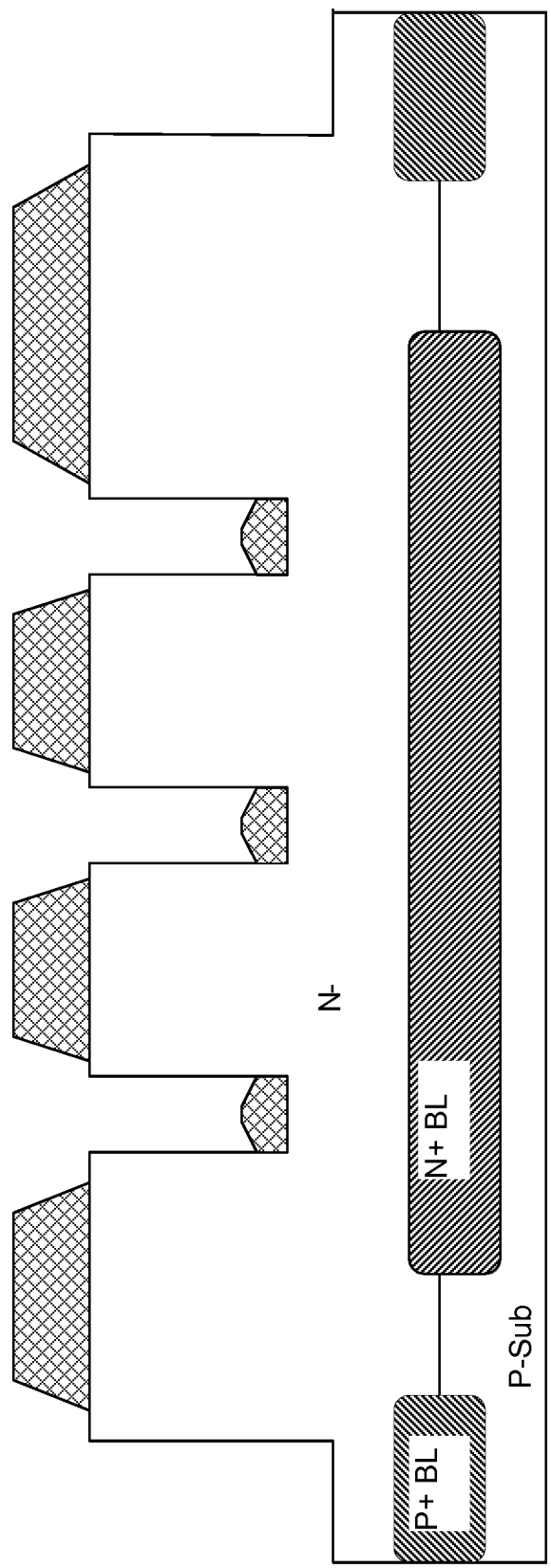

Then, a short wet oxide etch is performed to remove the thin oxide layer on the sidewalls of the trenches, as shown in FIG. 5E. As a result of the oxide etch, the oxide layer 84 remains on the top of the epitaxial layer and also at bottom portions of the trenches but is removed from the sidewall of the trenches. Then, an optional masking and etch step may be performed to remove the oxide layer 84 from the bottom of the trenches 26 for isolation structures, as shown in FIG. 5F.

Figure 5G:
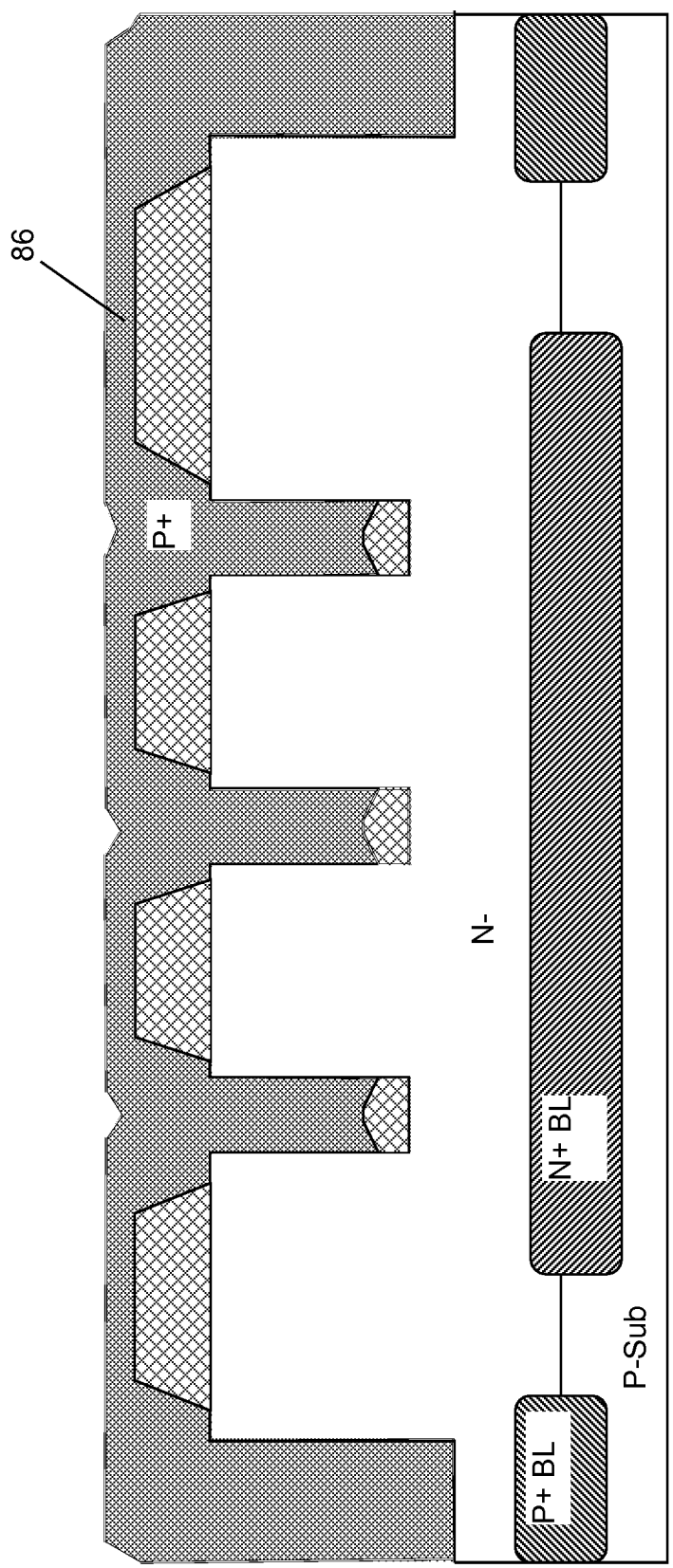
Figure 5H:
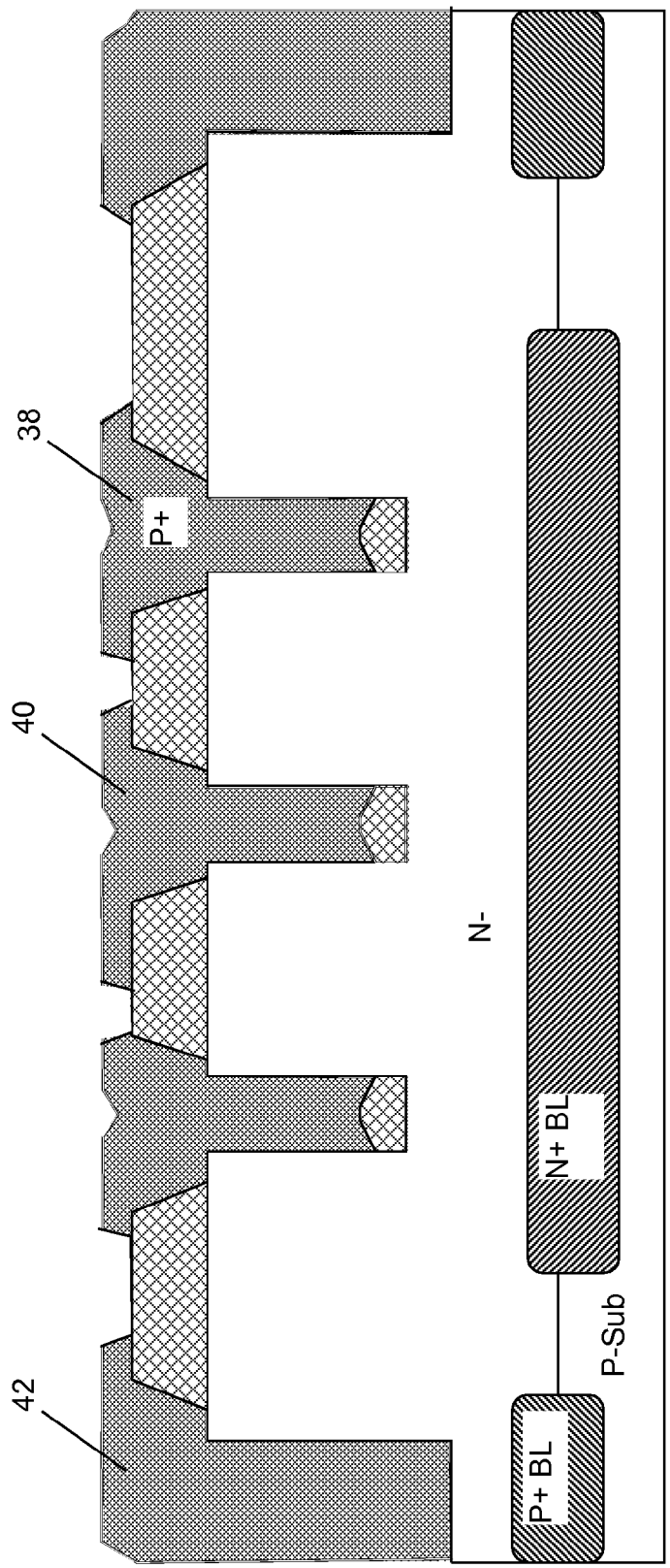
Figure 5I:
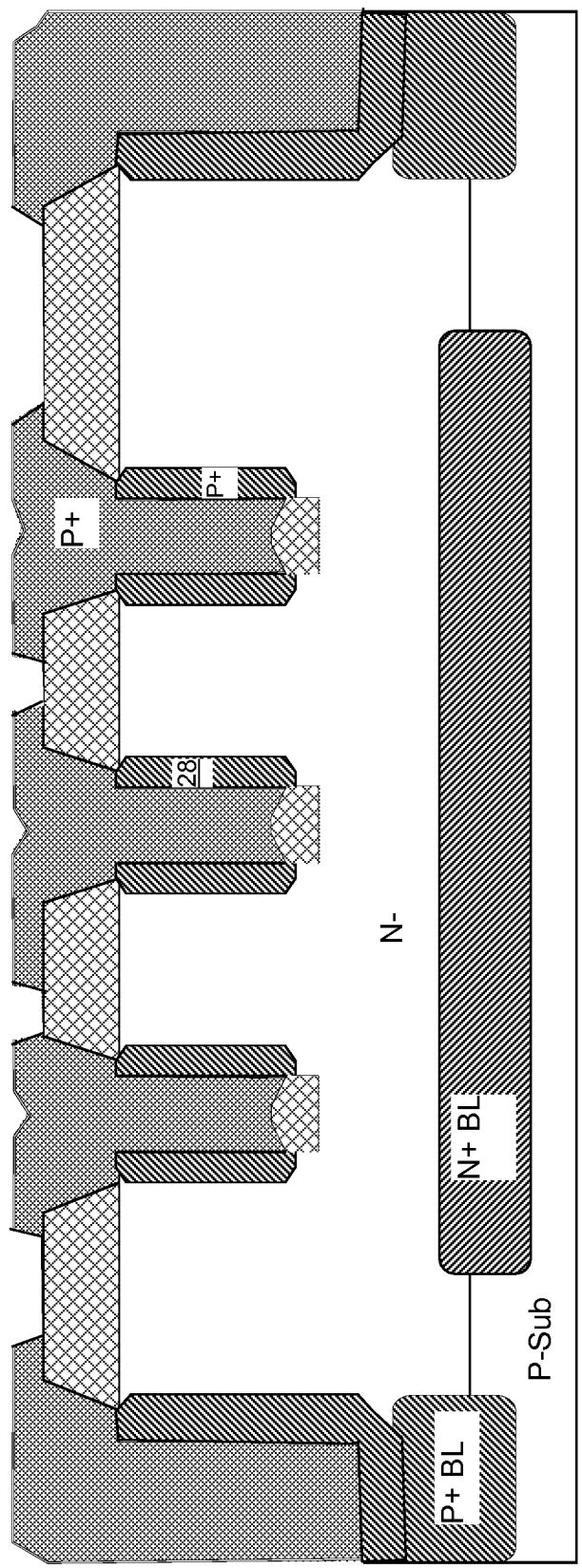

A polysilicon layer 86 is deposited, filling the trenches 24, 26 and forming a polysilicon layer above the surface of the oxide layer 84, as shown in FIG. 5G. In the present embodiment, the polysilicon layer 86 is a P+ heavily doped polysilicon layer. Then, the polysilicon layer 86 is patterned to form a collector interconnect ring 38 and an emitter field plate 40, as shown in FIG. 5H. The polysilicon layer 86 is further patterned to form an isolation structure field plate 42. Then, the entire device is annealed, causing the P+ dopants from the P+ heavily doped polysilicon layer 86 to out-diffuse into the sidewalls of the trenches 24 and the sidewalls and the bottoms of trenches 26, as shown in FIG. 5I. At the narrow trenches 24, the P+ regions 28 are formed only along the sidewall of the trenches because the oxide layer 84 remaining in the bottom portions of the trenches prevents out-diffusion of dopants at the narrow trench bottoms. However, at the wide trenches 26 where the bottom oxide is removed, the P+ dopants from the polysilicon layer 86 out-diffuse around the sidewalls and the bottoms of the trenches. The P+ diffusion region 28 of the isolation trenches 26 extends into the epitaxial layer to merge with the P+ buried layer 14 forming the isolation structure, as shown in FIG. 5I.

Figure 5J:
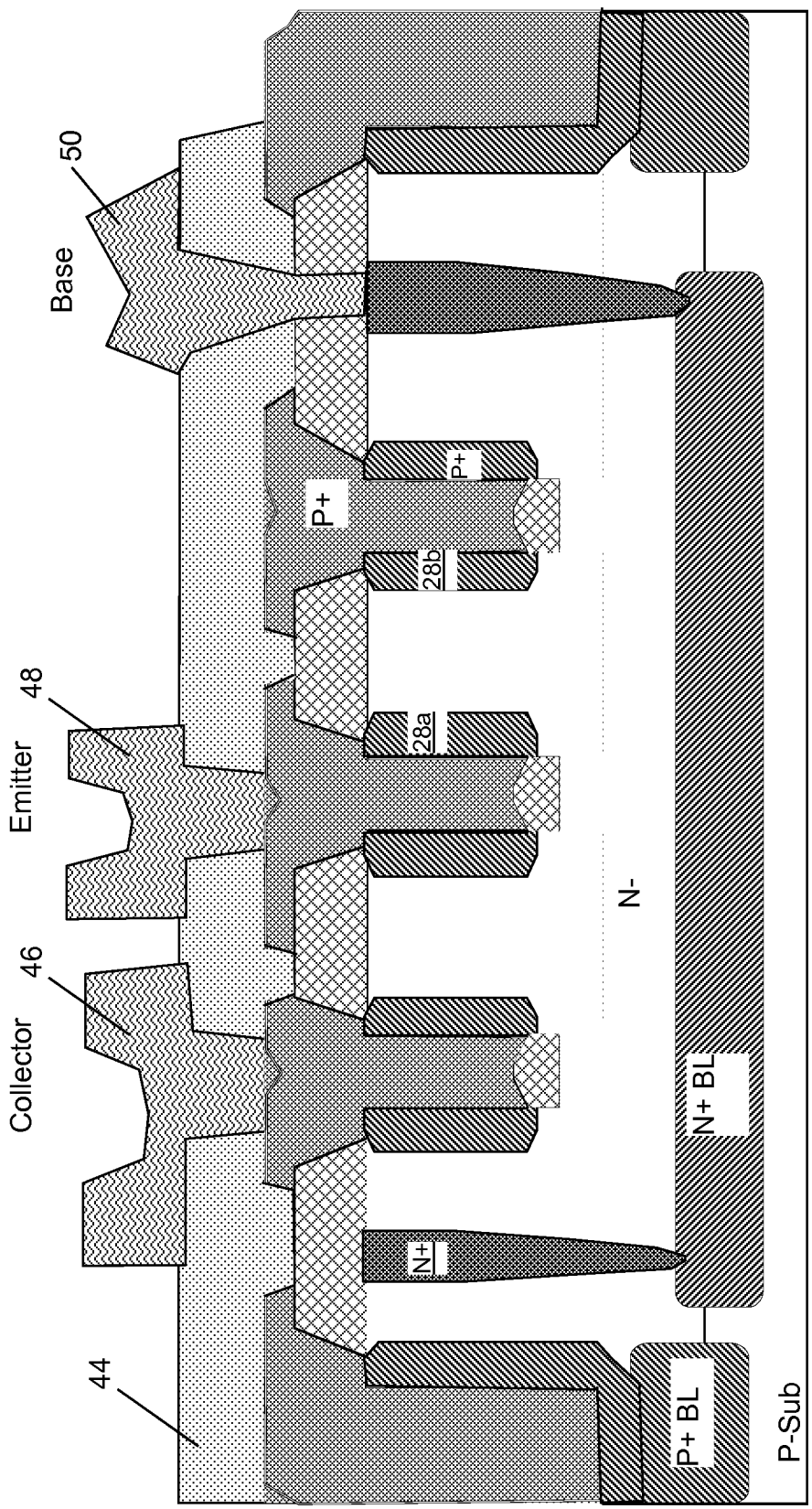

FIG. 5J illustrates one embodiment of a completed lateral PNP bipolar transistor formed using the fabrication process described above including the optional N+ sinkers 20. Metal contacts to the emitter, collector and base terminals of the PNP transistor are formed over contact openings in a dielectric layer 44, such as a BPSG layer. More specifically, a collector contact 46 is formed making electrical contact to the collector interconnector ring 38, an emitter contact 48 is formed making electrical contact to the emitter field plate 40, and a base contact 50 is formed making electrical contact to the N+ sinker 20. In this manner, a lateral PNP bipolar transistor is formed with the Emitter formed in P+ diffusion region 28a, the Collector formed in P+ diffusion region 28b, and the Base formed in the N-Epitaxial layer 18. In the present embodiment, the Collector is formed as a ring structure surrounding the Emitter. The Base is the distance between the P+ diffusion region 28a and P+ diffusion region 28b. As described above, N+ sinkers 20 electrically contacting the N+ buried layer has the effect of reducing the base resistance and there by disabling the vertical parasitic PNP transistor in the device. The lateral PNP transistor thus formed is more robust and is immune to undesired parasitic substrate conduction. Furthermore, the emitter field plate 40 overlying the base region acts as an electrostatic shield for the base region and has the effect of increasing the current gain of the transistor. The lateral PNP bipolar transistor as thus constructed is robust while realizing high performance.

Figure 6:
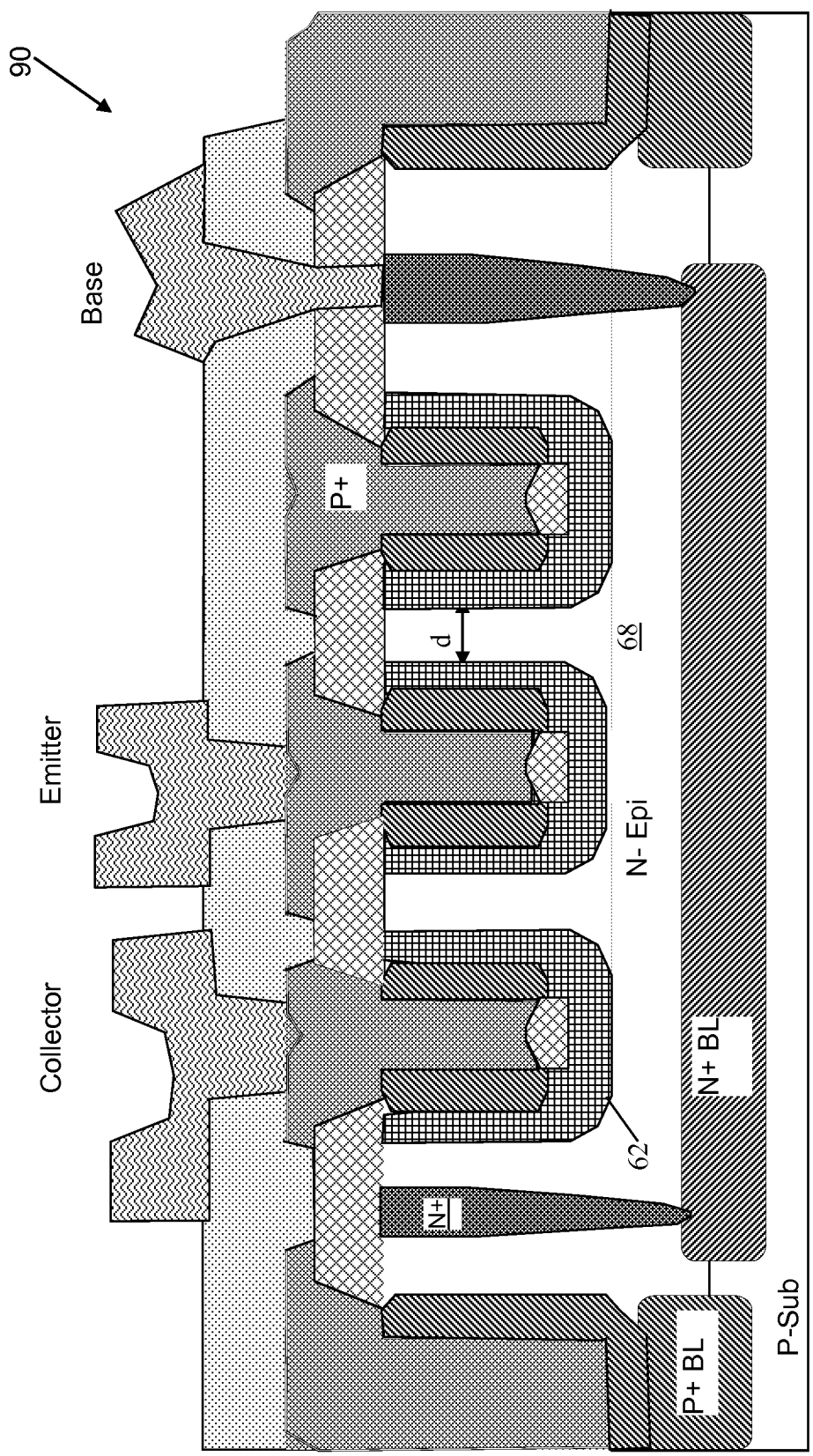
FIG. 6 is a cross-sectional view of a lateral PNP bipolar transistor according to a fourth alternate embodiment of the present invention.

FIG. 6 illustrates an alternate embodiment of a lateral PNP bipolar transistor formed in the same manner as the lateral PNP transistor in FIG. 5J but with the addition of laterally diffused base regions surrounding the emitter and collector diffusion regions. Referring to FIG. 6, a lateral PNP transistor 90 is formed using substantially the same fabrication process described above with reference to FIGS. 5A to 5J. However, lateral PNP transistor 90 is formed using an N-Epitaxial layer 68 having a lower doping level than the standard base doping level. That is, the doping level for N-Epitaxial layer 68 is lower than the doping level used in N-Epitaxial layer 18 in the above-embodiment. Then, after the trenches are formed and the oxide layer 84 have been deposited and etched, as shown in FIG. 5F, an additional N-Base implantation step is carried out to form N-Base regions 62 around all the trenches. The N-Base implants do not need to be blocked from the bottom of the narrow trenches. After the drive-in step, N-Base regions 62 are formed around all the trenches. N-Base regions 62 have a doping level higher than the doping level of the N-Epitaxial layer 68. Although the N-Base implants are also introduced to the wide trenches where the isolation structures are to be formed, the subsequent P+ auto-doping and drive-in and also the heavily doped P+ buried layer will overcome the N-Base implants. Therefore, no masking step is necessary for the N-Base implantation for the isolation trenches. After the N-Base implantation and drive-in, the subsequent processing steps, such as polysilicon deposition, can be carried out as described above with reference to FIGS. 5G to 5J. As thus constructed, lateral PNP transistor 90 includes a laterally diffused narrow base to achieve even higher performance.

Figure 7:
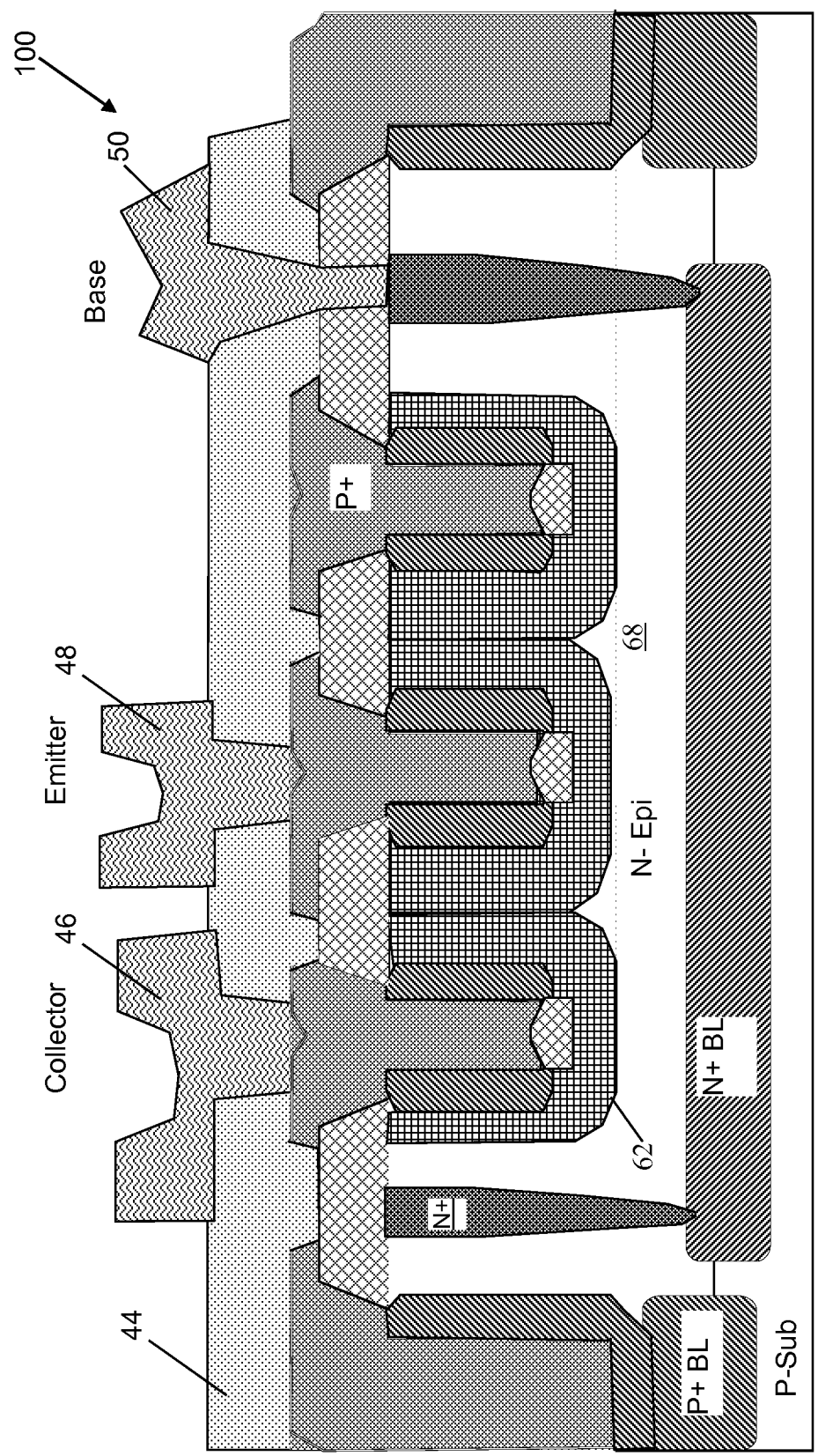
FIG. 7 is a cross-sectional view of a lateral PNP bipolar transistor according to a fifth alternate embodiment of the present invention.

In lateral PNP transistor 90, the Base includes part of the N-Epitaxial layer 68, denoted by a distance "d", between two adjacent N-Base regions 62. In this case, a given pitch size between the narrow trenches are used so as to leave the N-Epitaxial layer between the N-Base regions. In an alternate embodiment shown in FIG. 7, a smaller pitch between the narrow trenches can be used so that the N-Base regions 62 abut each other, with no N-Epitaxial layer left in the Base of the lateral PNP transistor. The lateral PNP transistor 100 thus constructed achieves high performance with a laterally diffused narrow base.

Alternate Embodiment

Nitride Mask

In the above-described embodiment, the HDP oxide layer 84 is formed over the epitaxial layer and masked for trench formation. The oxide layer 84 is left on the epitaxial layer for the remainder of the fabrication process and functions as an insulating layer for the epitaxial layer. According to an alternate embodiment of the present invention, a nitride mask is used in addition to the HDP oxide layer. Using the nitride mask has the benefits of protecting the top edges of the trenches and to minimize P-type dopant auto-diffusion from the overlying polysilicon layer. FIGS. 8A to 8J are cross-sectional views illustrating the process step for fabricating a lateral PNP bipolar transistor according to alternate embodiments of the present invention.

Figure 8A:
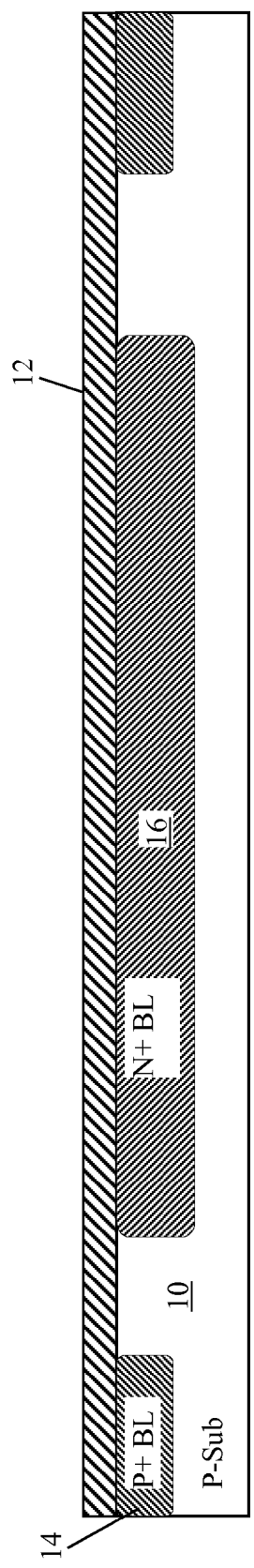
FIGS. 8A to 8J are cross-sectional views illustrating the process step for fabricating a lateral PNP bipolar transistor according to alternate embodiments of the present invention.

Referring to FIGS. 8A to 8J, the lateral PNP transistor is formed on a P-type silicon substrate 10. A buffer oxide layer 12 may be formed on the top surface of the substrate 10 before the ion implantation steps that follow to form P+ buried layer 14 and N+ buried layer 16. The P+ buried layer 14 and the N+ buried layer 16 are formed using separate masking and ion implantation steps. One or more anneals can be performed to drive in the implanted dopants, thereby forming the buried layers as shown in FIG. 8A.

Figure 8B:
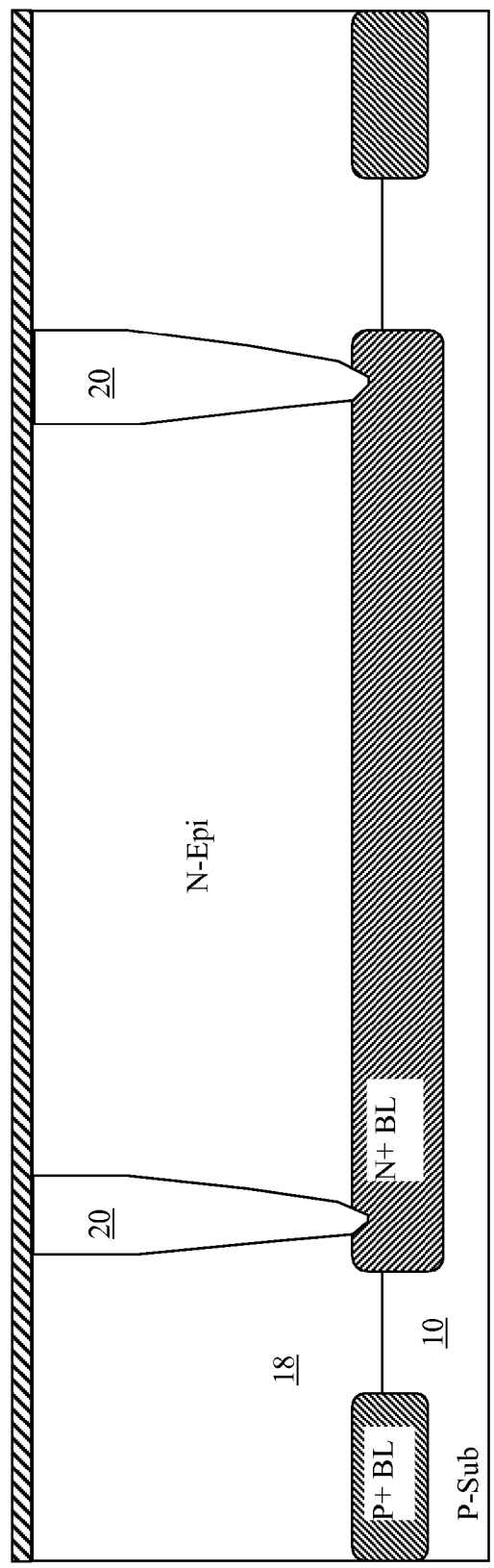

The buffer oxide layer 12 is then removed and an N-type Epitaxial layer 18 is formed on the substrate 10, as shown in FIG. 8B. In an alternate embodiment, N-type Epitaxial layer 18 is doped to a dopant level typically used for N-wells. A buffer oxide may be formed on the N-Epitaxial layer 18. In some embodiments, N+ sinker implantation steps to form N+ sinkers contacting the N+ buried layer may be performed as described above.

Figure 8C:
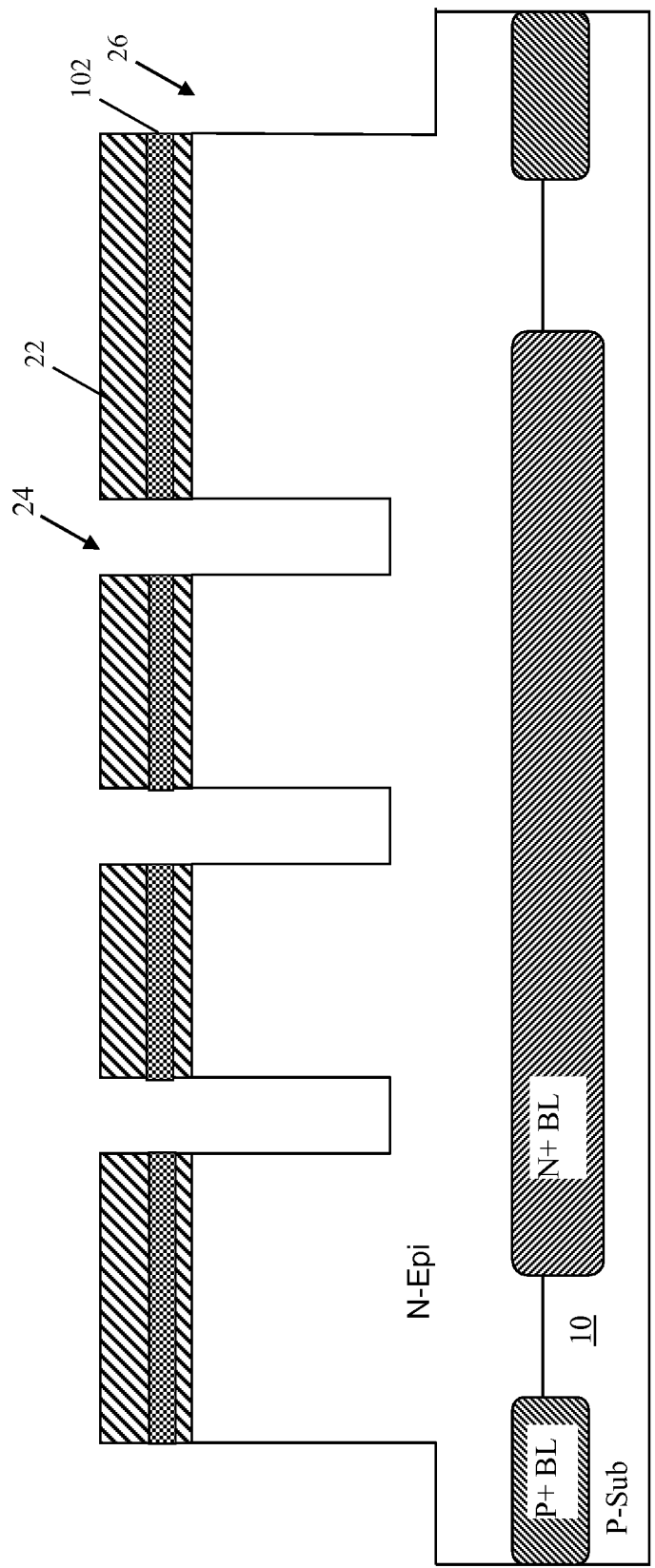

After the N-Epitaxial layer 18 is formed, a nitride layer 102 is deposited on the buffer oxide of the epitaxial layer. Then, a thick oxide hard mask 22 is formed on the nitride layer. The oxide hard mask 22 and the nitride layer 102 are first patterned to define areas where trenches in the epitaxial layer are to be formed. The oxide hard mask 22, the nitride layer 82 and the pad oxide are etched down to the silicon surface of the epitaxial layer. Next, a trench etch follows where the exposed silicon is etched to form narrow trenches 24 for forming trench emitters and collectors and wider trenches 26 for forming trench isolation structures, as shown in FIG. 8C.

Figure 8D:
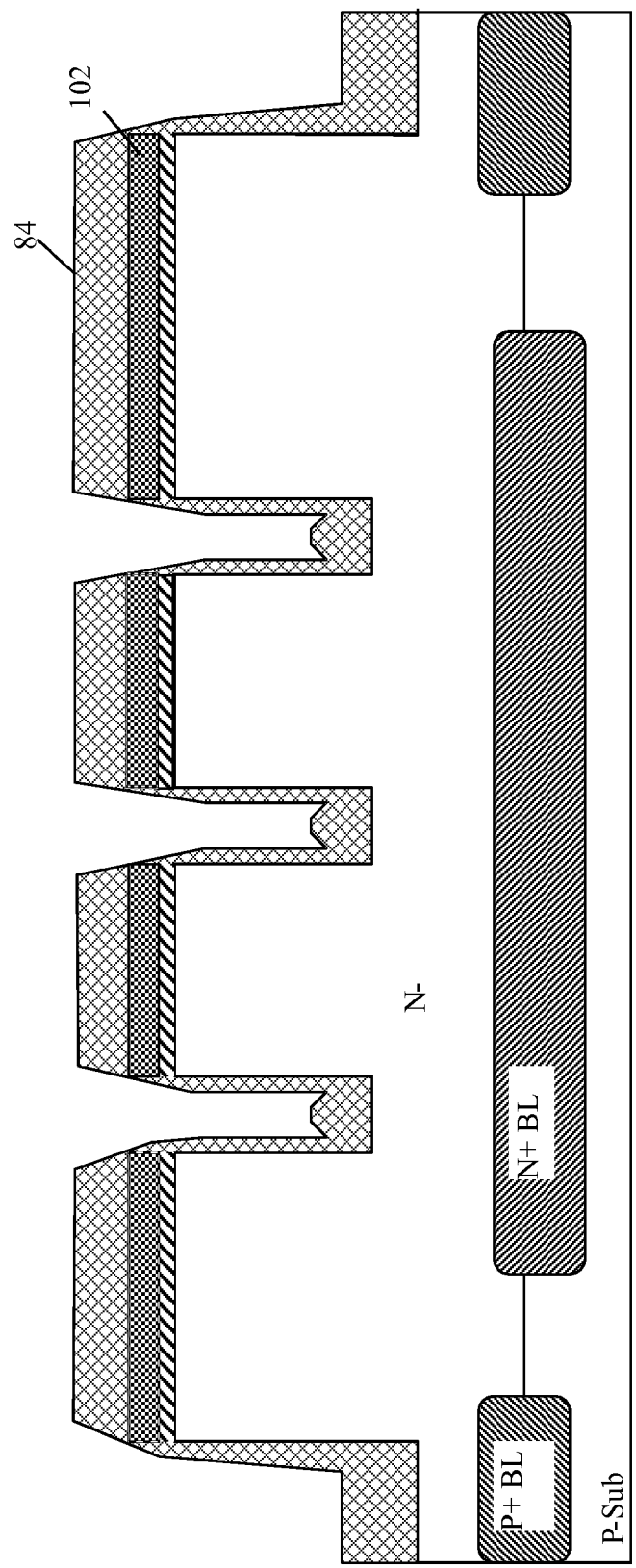

Next, the oxide hardmask 22 is removed and a second oxide layer 84 is deposited on the silicon surfaces, including the top of the nitride layer and the sidewalls and bottom portions of the trenches, as shown in FIG. 8D. In one embodiment, the second oxide layer 84 is a high density plasma (HDP) oxide. HDP oxide is deposited in such a way that a thick oxide layer results in the bottom portions of the trenches and on top of the epitaxial layer while a thin oxide layer results along the sidewalls of the trenches. A densification step may then follow to densify the HDP oxide.

Figure 8E:
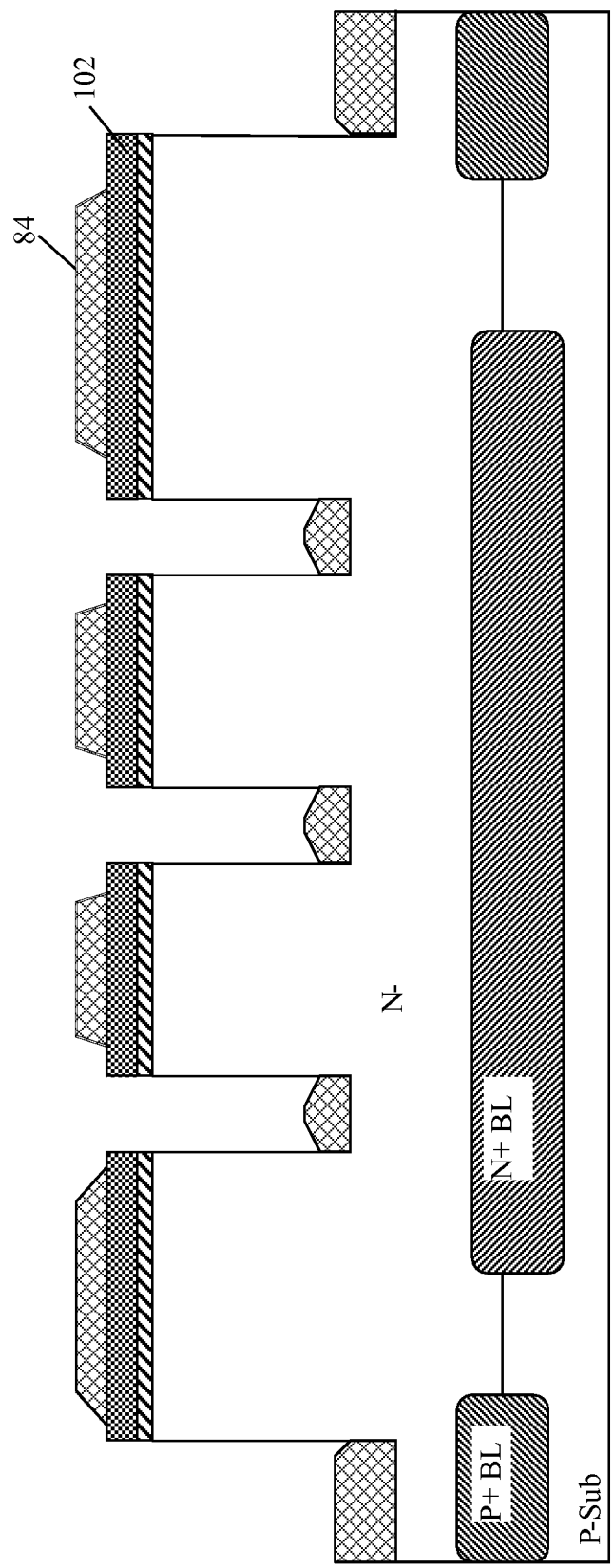
Figure 8F:
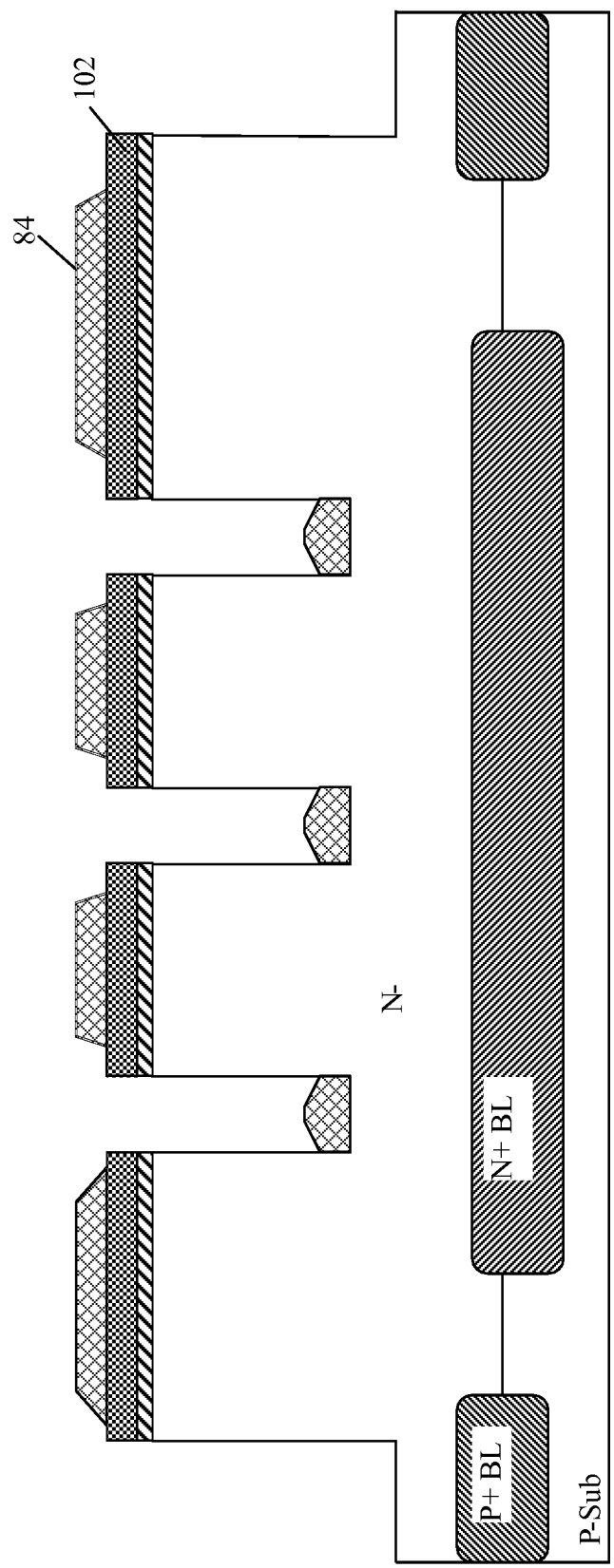

Then, a short wet oxide etch is performed to remove the thin oxide layer on the sidewalls of the trenches, as shown in FIG. 8E. As a result of the oxide etch, the oxide layer 84 remains on the top of the nitride layer and also at bottom portions of the trenches but is removed from the sidewalls of the trenches. Then, an optional masking and etch step may be performed to remove the oxide layer 84 from the bottom of the trenches 26 for isolation structures, as shown in FIG. 8F. The nitride layer 102, which is not affected by the oxide etch, remains intact on the top of the epitaxial layer. In this manner, the nitride layer 102 protects the top edges of the trenches from subsequent auto-doping from the polysilicon layer, thereby minimizing excessive dopant penetration at the top corners of the trenches. More specifically, when the epitaxial layer is covered only by the HDP oxide, the oxide etch will cause the oxide layer on the top of the epitaxial layer to recess from the top corners of the trenches, as shown in FIG. 5E. Then, when the heavily doped polysilicon layer is formed above the oxide layer and auto-doping is carried out, the P+ diffusion region may extend further into the epitaxial layer at the top corners of the trenches as opposed to the sidewalls of the trenches, as shown in FIG. 5I. The use of a nitride layer over the epitaxial layer prevents this excessive dopant penetration at the top corners of the trenches, as will be described in more detail below.

Figure 8G:
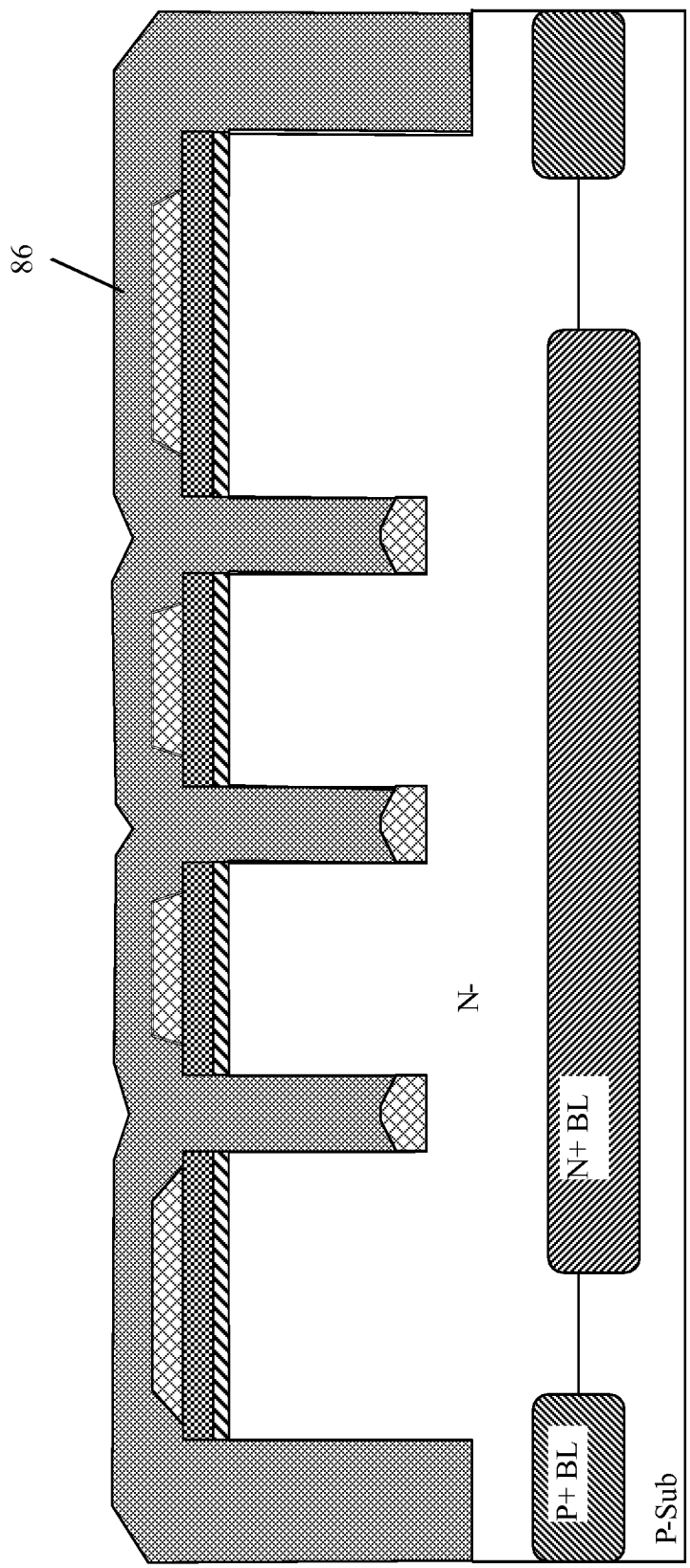
Figure 8H:
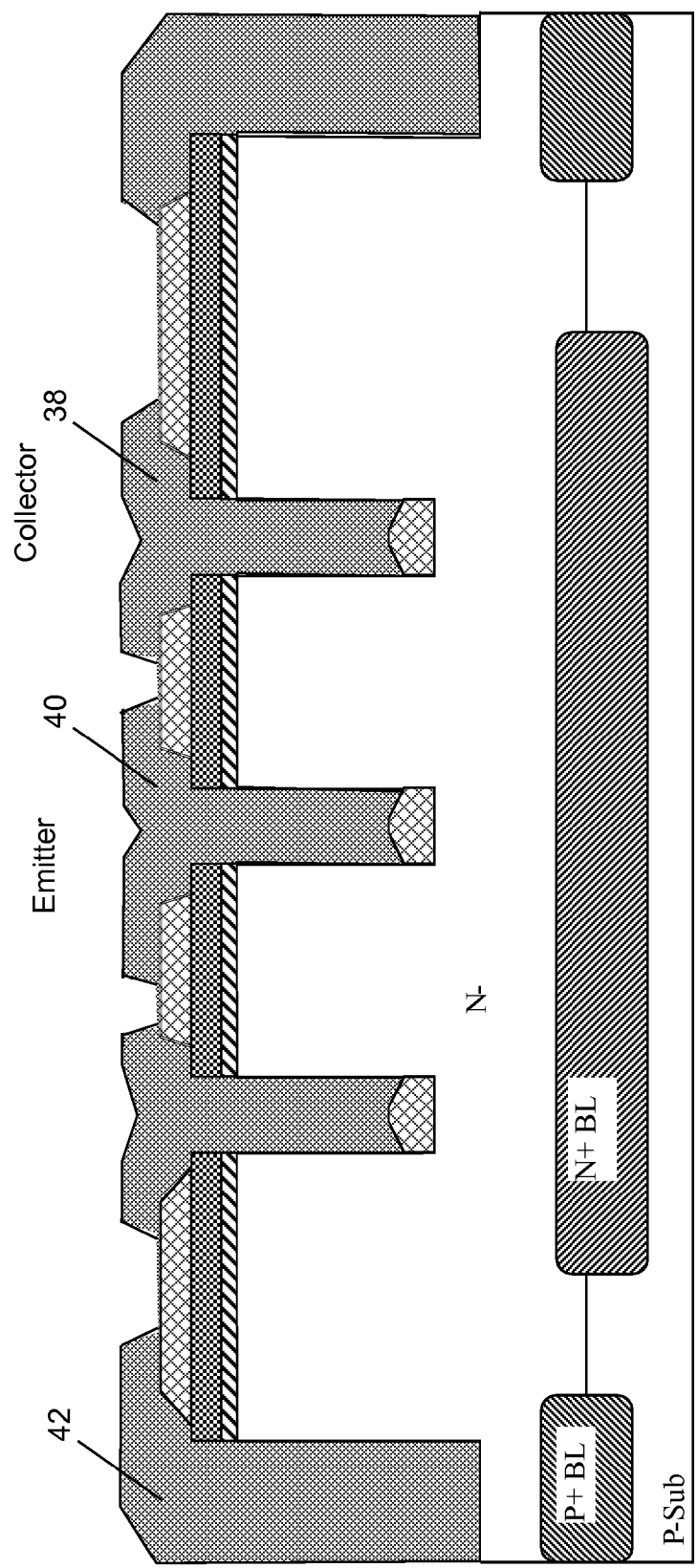
Figure 8I:
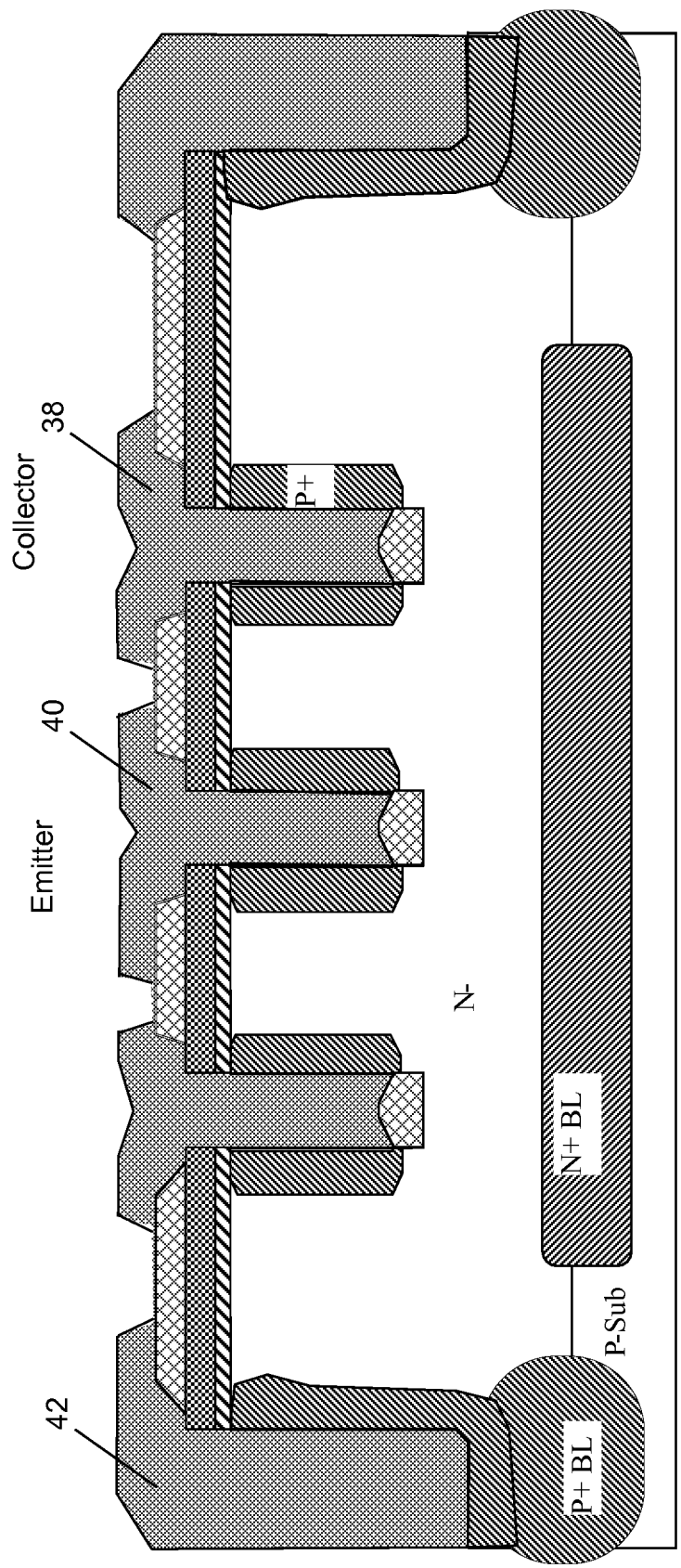
Figure 8J:
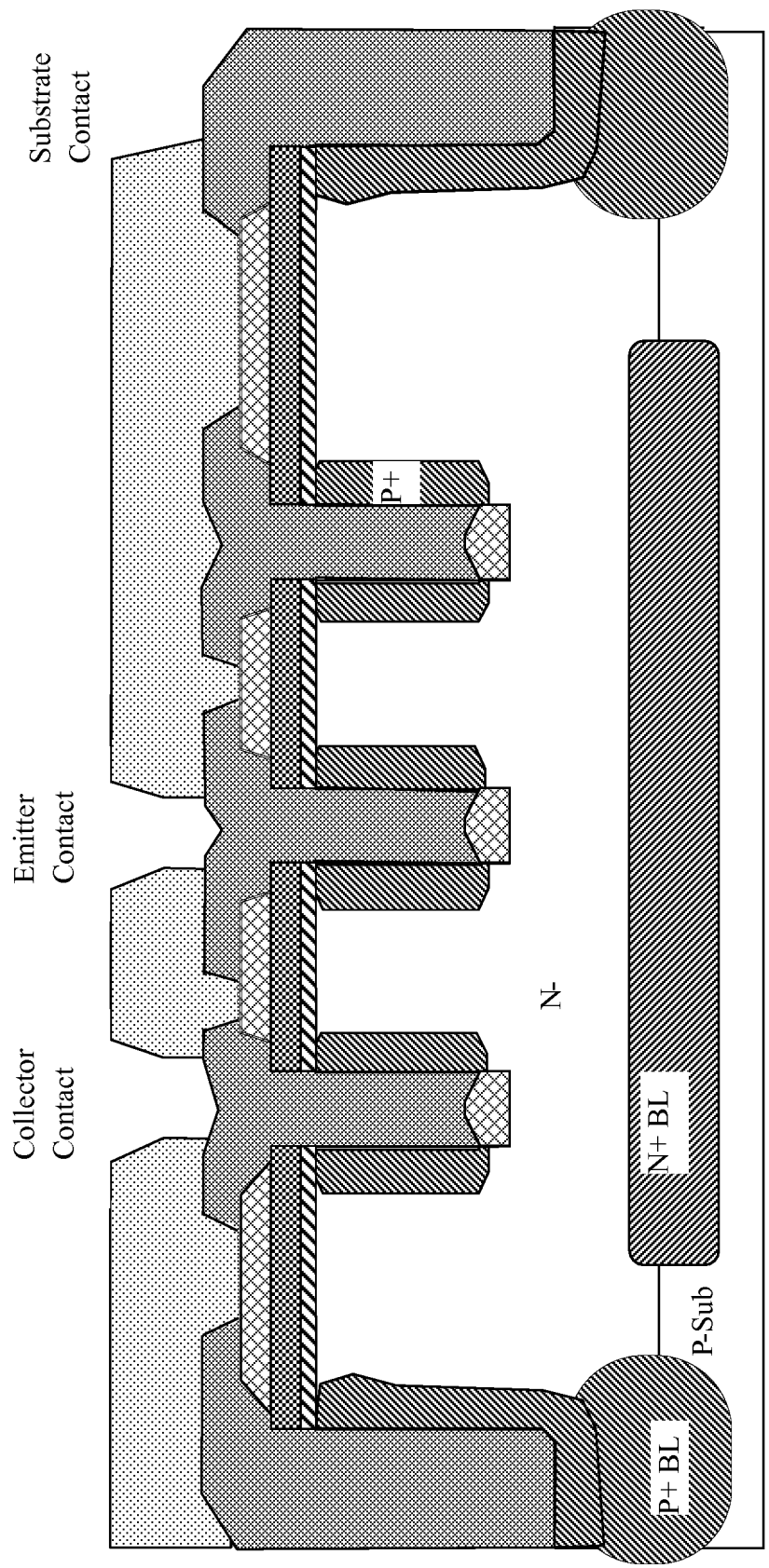

After the HDP oxide layer 84 is etched, a polysilicon layer 86 is deposited, filling the trenches 24, 26 and forming a polysilicon layer above the surface of the oxide layer 84, as shown in FIG. 8G. In the present embodiment, the polysilicon layer 86 is a P+ heavily doped polysilicon layer. Then, the polysilicon layer 86 is patterned to form a collector interconnect ring 38 and an emitter field plate 40, as shown in FIG. 8H. The polysilicon layer 86 is further patterned to form an isolation structure field plate 42. Then, the entire device is annealed, causing the P+ dopants from the P+ heavily doped polysilicon layer 86 to out-diffuse into the sidewalls of the trenches 24 and the sidewalls and the bottoms of trenches 26, as shown in FIG. 8I. At the narrow trenches 24, the P+ regions 28 are formed only along the sidewall of the trenches because the oxide layer 84 remaining in the bottom portions of the trenches prevents out-diffusion of dopants at the narrow trench bottoms. However, at the wide trenches 26 where the bottom oxide is removed, the P+ dopants from the polysilicon layer 86 out-diffuse around the sidewalls and the bottoms of the trenches. The P+ diffusion region 28 of the isolation trenches 26 extends into the epitaxial layer to merge with the P+ buried layer 14 forming the isolation structure, as shown in FIG. 8I.

After the annealing processing to form P+ diffusion regions 28, the remaining processing steps for completing the lateral PNP transistor are performed. For instance, a dielectric layer 44, such as a BPSG layer, is deposited on the polysilicon layer and is patterned to form collector, emitter and substrate contact openings. Then metal deposition and patterning may be performed to forms contacts to the emitter, collector and base of the PNP transistors. The lateral PNP transistor thus formed is more robust and is immune to undesired parasitic substrate conduction. Furthermore, the emitter field plate 40 overlying the base region acts as an electrostatic shield for the base region and has the effect of increasing the current gain of the transistor. The lateral PNP bipolar transistor as thus constructed is robust while realizing high performance.

(3) Lateral PNP in Multi-Layer Epitaxial Layers

Figure 9A:
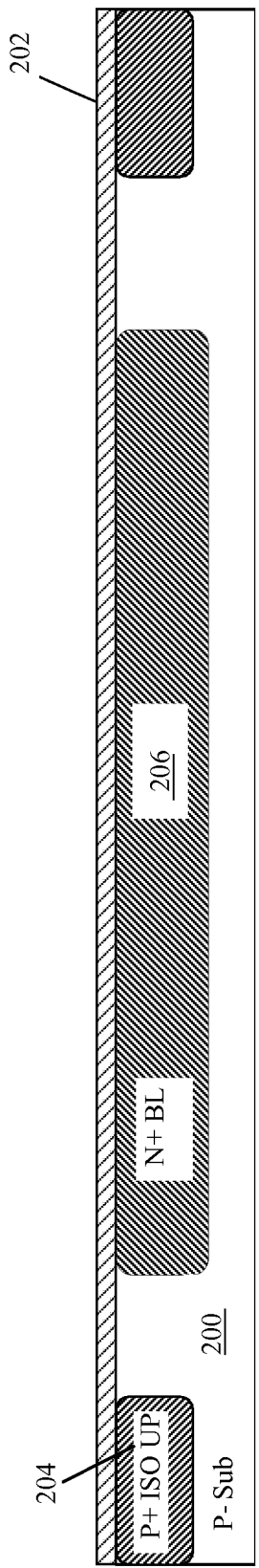
FIGS. 9A to 9D are cross-sectional views illustrating the process step for fabricating a lateral PNP bipolar transistor according to alternate embodiments of the present invention.

According to another aspect of the present invention, a lateral bipolar transistor with deep emitter and deep collector regions is formed using multiple epitaxial layers of the same conductivity type. FIGS. 9A to 9D are cross-sectional views illustrating the process step for fabricating a lateral PNP bipolar transistor according to alternate embodiments of the present invention. Referring to FIGS. 9A to 9D, the lateral PNP transistor is formed on a P-type silicon substrate 200. A buffer oxide layer 202 may be formed on the top surface of the substrate 200 before the ion implantation steps that follow to form P+ buried layer 204 and N+ buried layer 206. The P+ buried layer 204 is also referred to as an "ISO Up" (isolation up) region as referring to a buried layer for an isolation structure that diffuses to merge with an overlying diffusion region. The P+ ISO UP layer 204 and the N+ buried layer 206 are formed using separate masking and ion implantation steps. One or more anneals can be performed to drive in the implanted dopants, thereby forming the P+ ISO Up and N+ buried layers as shown in FIG. 9A.

Figure 9B:
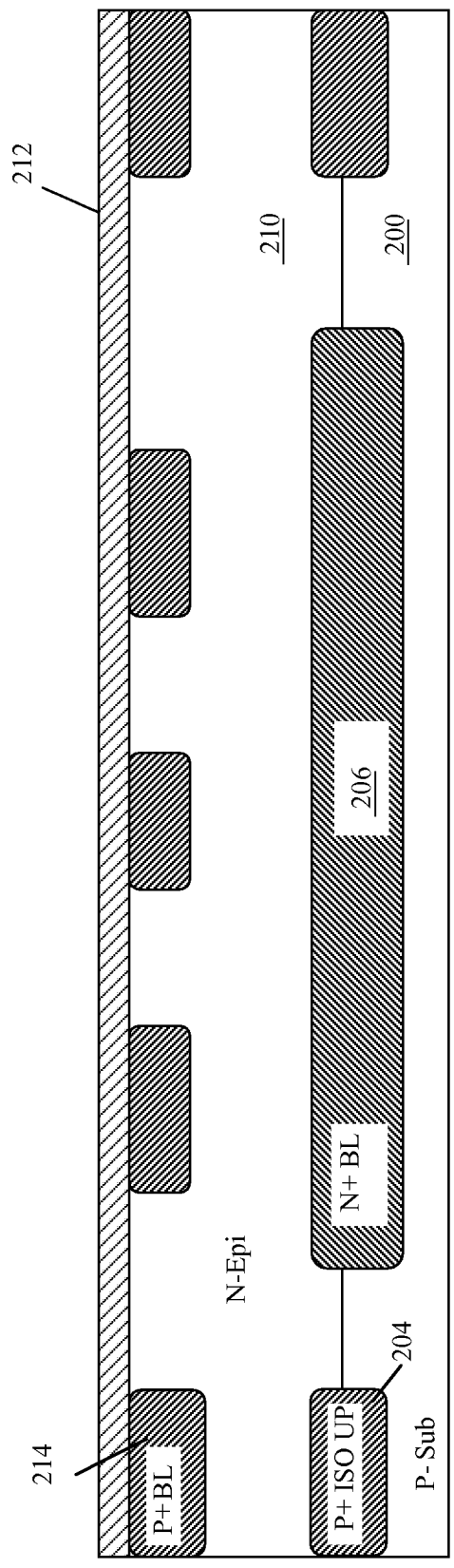

The buffer oxide layer 202 is then removed and a first N-type Epitaxial layer 210 is formed on the substrate 200, as shown in FIG. 9B. A pad oxide layer 212 is grown on the first epitaxial layer 210. Then, a masking step is performed to define areas for P+ buried layers 214. An ion implantation step using P-type dopants, such as Boron, then follows to form P+ buried layers 214, as shown in FIG. 9B. One or more of the P+ buried layers 214 are aligned vertically with the P+ ISO UP layer 204. An optional anneal may be performed. In some embodiments, a masking and high dose phosphorus ion implantation step is performed to form N+ sinkers (not shown) which are heavily doped N-type regions for contacting the N+ buried layer 206, as described above. N+ sinkers are optional and may be omitted in some embodiments of the present invention.

Figure 9C:
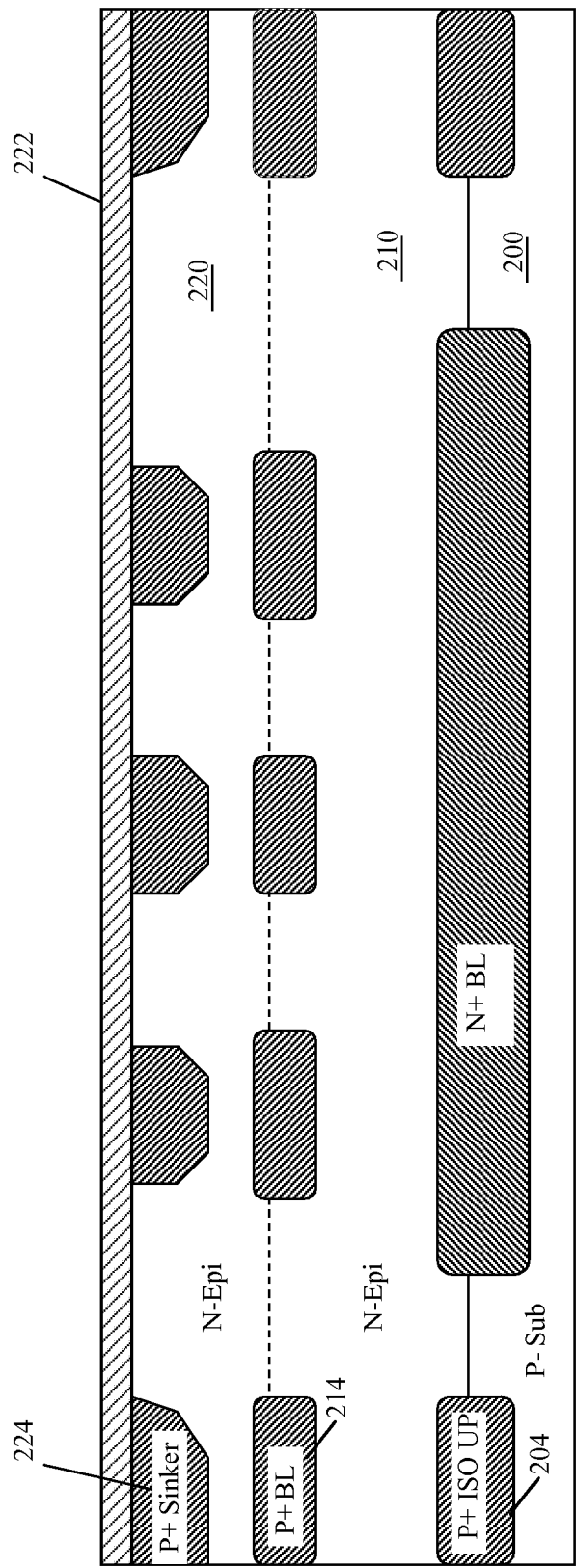

Then, the pad oxide layer 212 is removed and a second N-type Epitaxial layer 220 is formed on the first epitaxial layer 210, as shown in FIG. 9C. A pad oxide layer 222 is grown on the second epitaxial layer 220. Then, another masking step is performed to define areas for P+ sinker regions 224. An ion implantation step using P-type dopants, such as Boron, then follows. The P+ sinker implantation step is carried out at high does for a deep implantation, as shown in FIG. 9C. The P+ sinker regions 224 are aligned vertically with the P+ buried layers 214. In some embodiments, a masking and high dose phosphorus ion implantation step can be performed to form N+ sinkers (not shown) for contacting the N+ sinkers formed in the first epitaxial layer. N+ sinkers are optional and may be omitted in some embodiments of the present invention.

Figure 9D:
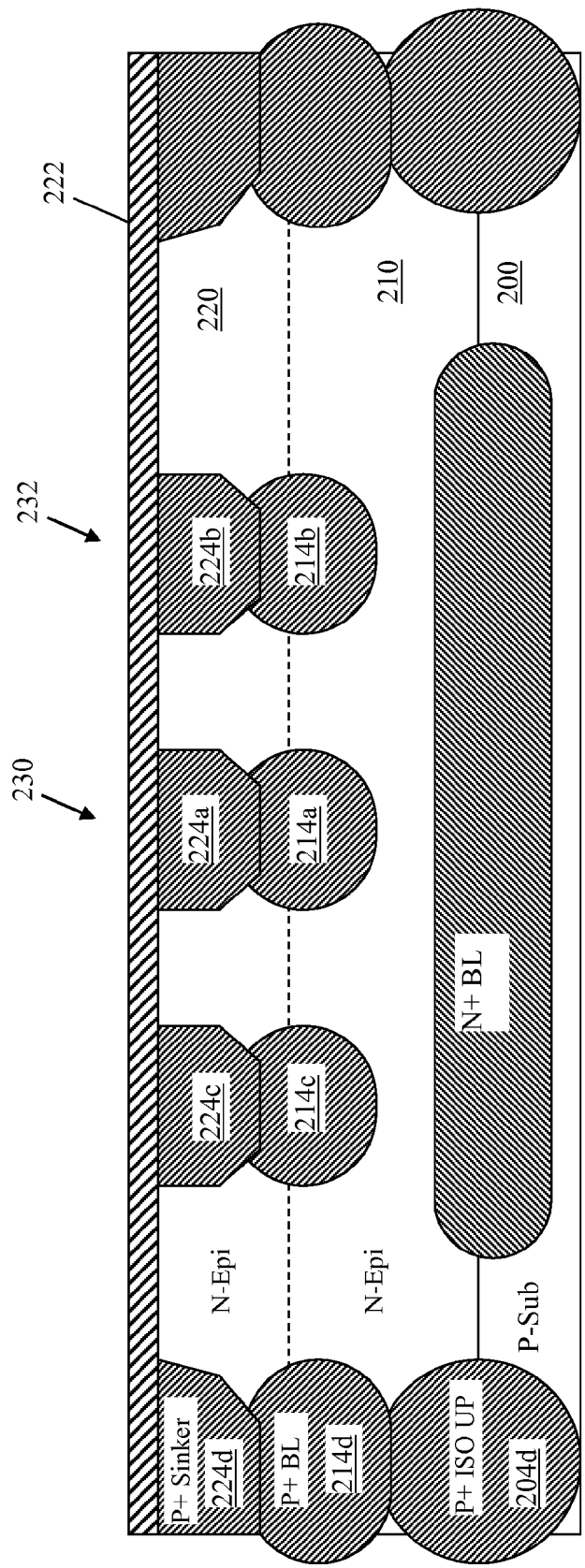

Then, the semiconductor device including the first and second epitaxial layers 210, 220 are annealed and the implanted dopants from P+ ISO UP layer 204, the P+ buried layers 214 and the P+ sinker regions 224 diffuse so that the vertically aligned implanted regions merge into each other, as shown in FIG. 9D. More specifically, P+ sinker region 224a is merged with P+ buried layer 214a to form a contiguous P+ region which can be used to form the emitter 230 of a lateral PNP transistor. P+ sinker region 224b is merged with P+ buried layer 214b to form a contiguous P+ region which can be used to form the collector 232 of a lateral PNP transistor. In the case the collector is formed as a ring around the emitter, P+ sinker region 224c and P+ buried layer 214c can be connected to or formed as a ring region around P+ sinker region 224a and P+ buried layer 214a. Finally, P+ sinker region 224d is merged with P+ buried layer 214d and further merged with P+ ISO UP region 204*d* to form a contiguous P+ region which can be used to form an isolation structure 234 for the lateral PNP transistor.

Subsequent processing steps can then be performed to complete the lateral PNP transistor, including dielectric deposition, contact mask and etch and contact metallization.

As thus constructed, a lateral PNP transistor with deep emitter and deep collector regions are formed without the use of trenches. In the present embodiment, the lateral PNP bipolar transistor is formed using two N-type epitaxial layers. In other embodiments, three or more N-type epitaxial layers successively formed on the substrate may be used to form deep emitter and collector regions. Each N-type epitaxial layer includes heavily doped P+ regions which are vertically aligned with P+ regions formed in the adjacent epitaxial layers so that all vertically aligned P+ regions are merged into a single vertical diffusion region after the annealing process. In this manner, a lateral PNP transistor with deep emitter and deep collector regions is formed.

(4) Trench PNP with Gated Junction

Figure 10:
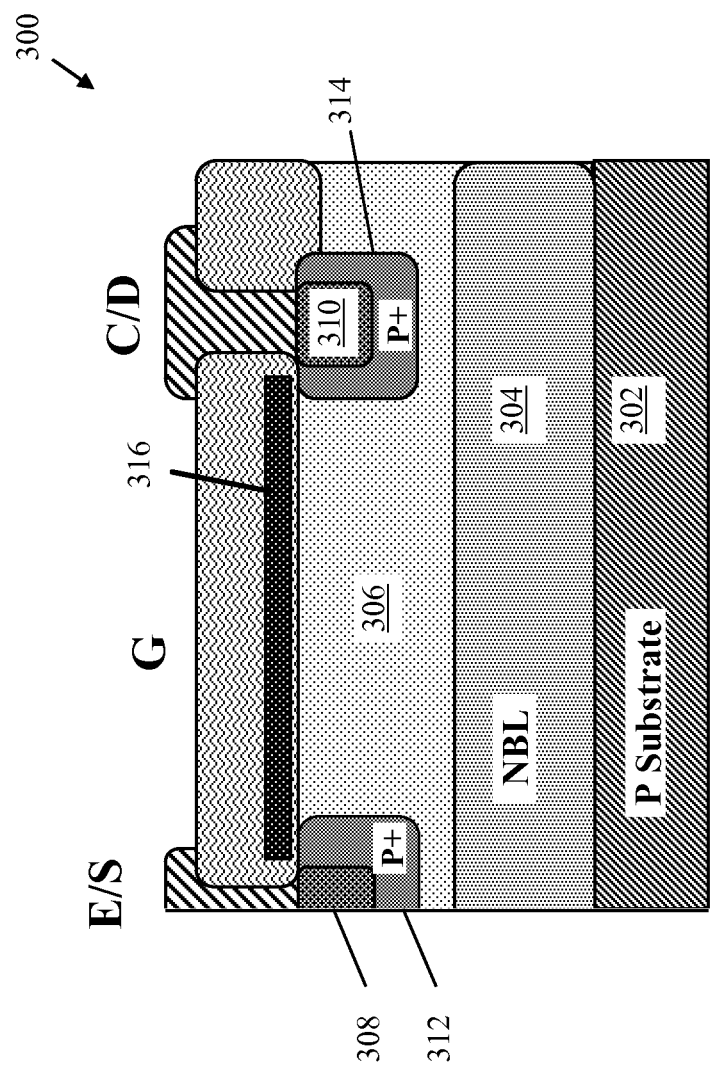
FIG. 10 is a cross-sectional view of a lateral trench bipolar transistor according to one embodiment of the present invention.

FIG. 10 is a cross-sectional view of a lateral trench bipolar transistor according to one embodiment of the present invention. Referring to FIG. 10, a lateral bipolar transistor 300 is formed on a P-type substrate 302 with a N-type buried layer 304 formed thereon. An N-type epitaxial layer 306 is formed on the P-type substrate 302. Trenches 308, 310 are formed in the epitaxial layer 306 and filled with P+ doped polysilicon or metal. When the trenches are filled with P+ doped polysilicon, out-diffusion of P-type dopant during subsequent anneal forms P+ diffusion regions 312 and 314 around the trenches. A gate polysilicon 316, separated from the N-epitaxial layer 306 by a gate oxide layer, is formed over the N-epitaxial layer between the two trenches. A dielectric layer is formed over the gate polysilicon and contacts are made to the trenches.

As thus constructed, the trenches 308, 310 form the emitter and collector terminals of the lateral PNP transistor. More specifically, the emitter is formed in trench 308 while the collector is formed in trench 310. The base is formed in the N-Epitaxial layer 306 and contact to the base can be made through an N+ sinker to the N+ buried layer 304.

In one embodiment, the gate polysilicon 316 is electrically shorted to the emitter so that the gate polysilicon functions as a field plate for the base region. In another embodiment, the gate polysilicon 316 is used as a gate control to provide breakdown voltage tuning More specifically, the gate control can be used to vary the emitter-to-gate breakdown voltage.

(5) Merged Lateral PNP and LDMOS

Figure 11:
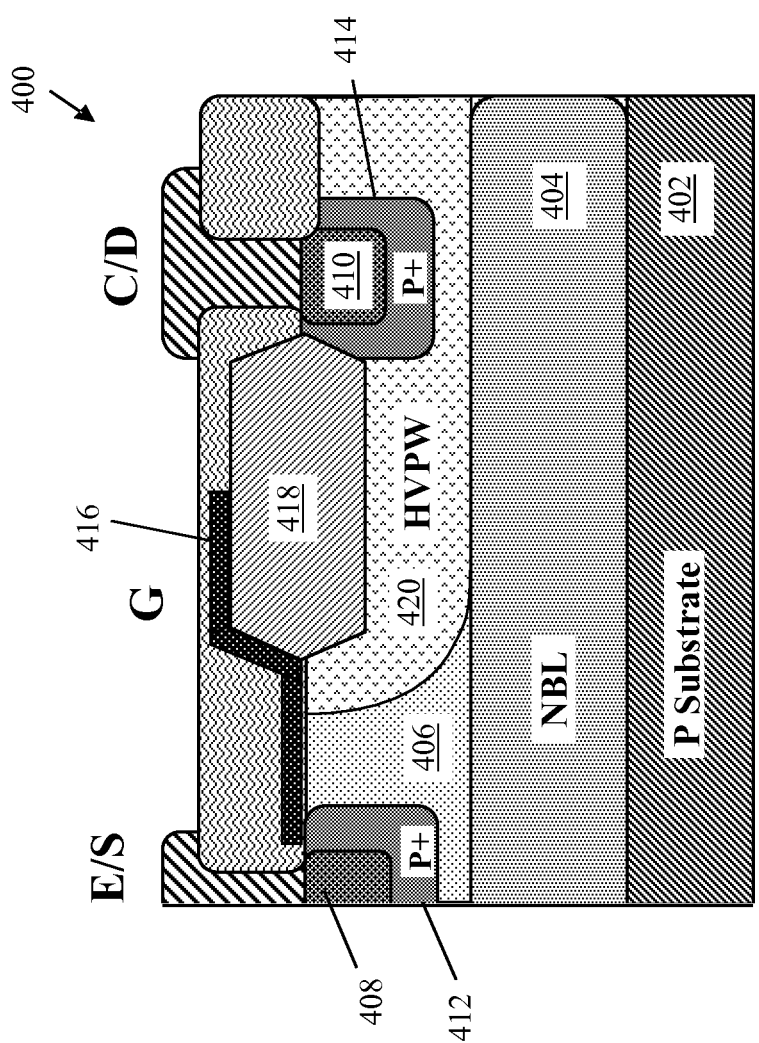
FIG. 11 is a cross-sectional view of a merged lateral PNP bipolar transistor with a LDMOS transistor according to one embodiment of the present invention.

FIG. 11 is a cross-sectional view of a merged lateral PNP bipolar transistor with a LDMOS transistor according to one embodiment of the present invention. Referring to FIG. 11, a lateral bipolar transistor 400 is formed on a P-type substrate 402 with a N-type buried layer 404 formed thereon. An N-type epitaxial layer 406 is formed on the P-type substrate 402. A high-voltage P-well 420 is formed in the N-Epitaxial layer 406 to form the drift region of the LDMOS transistor. The high-voltage P-well 420 has a dopant concentration lower than a standard P-well to allow the P-well to withstand high voltages. A field oxide layer 418 is formed on the top surface of the N-Epitaxial layer and in the P-well 420.

A trench 408 is formed in the epitaxial layer 406 while another trench 410 is formed in the high-voltage P-well 420 on the far-side of the field oxide layer 418. Both trenches are then filled with P+ doped polysilicon or metal.

When the trenches are filled with P+ doped polysilicon, out-diffusion of P-type dopant during subsequent anneal forms P+ diffusion regions 412 and 414 around the trenches. A gate polysilicon 416, separated from the N-epitaxial layer 406 by a gate oxide layer, is formed over the N-epitaxial layer from trench 408, over the P-well 420 and over the field oxide layer 418. A dielectric layer is formed over the gate polysilicon and contacts are made to the trenches.

As thus constructed, the trenches 408, 410 form the emitter and collector terminals of the lateral PNP transistor. More specifically, the emitter is formed in trench 408 while the collector is formed in trench 410. The base is formed in the N-Epitaxial layer 406 and contact to the base can be made through an N+ sinker to the N+ buried layer 404. An LDMOS transistor is formed by the gate polysilicon 416 and the emitter terminal functioning as the source and the collector terminal functioning as the drain. The LDMOS transistor has the effect of increasing the emitter/source to gate breakdown voltage.

The above detailed descriptions are provided to illustrate specific embodiments of the present invention and are not intended to be limiting. Numerous modifications and variations within the scope of the present invention are possible. The present invention is defined by the appended claims.

We claim:

1. A lateral bipolar transistor, comprising:
   a semiconductor substrate of a first conductivity type;
   a first buried layer of the first conductivity type and a second buried layer of a second conductivity type both formed on the substrate, the second conductivity type being opposite the first conductivity type;
   a first epitaxial layer of the second conductivity type formed on the substrate;
   third, fourth, and fifth buried layers of the first conductivity type formed in the first epitaxial layer, the third buried layer being formed in vertical alignment with the first buried layer, the fourth and fifth buried layers being positioned above and separated from the second buried layer;
   a second epitaxial layer of the second conductivity type formed on the first epitaxial layer; and
   first, second and third sinker regions of the first conductivity type formed in the second epitaxial layer, the first sinker region being in vertical alignment with the third buried layer, the second sinker region being in vertical alignment with the fourth buried layer, and the third sinker region being in vertical alignment with the fifth buried layer,
   wherein the first buried layer, the third buried layer and the first sinker region form a contiguous diffusion region of the first conductivity type and function as an isolation structure, the fourth buried layer and the second sinker region form a contiguous diffusion region of the first conductivity type and function as an emitter region, the fifth buried layer and the third sinker region form a contiguous diffusion region of the first conductivity type and function as a collector region, a base region being formed in the first and second epitaxial layers between the emitter and collector regions.

2. The lateral bipolar transistor of claim 1, further comprising:
   a fourth sinker diffusion region of the second conductivity type formed in the first and second epitaxial layers and extending to and being in electrical contact with the second buried layer.

3. The lateral bipolar transistor of claim 1, wherein the first conductivity type is P-type conductivity and the second conductivity type is N-type conductivity.

4. A method for fabricating a lateral bipolar transistor, comprising:

providing a semiconductor substrate of a first conductivity type;

forming a first buried layer of the first conductivity type and a second buried layer of a second conductivity type in the substrate, the second conductivity type being opposite the first conductivity type;

forming one or more epitaxial layers of the second conductivity type successively on the substrate;

forming two or more buried layers of the first conductivity type in each of the one or more epitaxial layers, the buried layer in each epitaxial layer being positioned above and separated from the second buried layer and being formed in vertical alignment with the buried layers formed in an adjacent epitaxial layer;

forming a last epitaxial layer of the second conductivity type on the last one of the one or more epitaxial layers;

forming first and second diffusion regions of the first conductivity type on the last epitaxial layer, each of the first and second diffusion regions being in vertical alignment with a respective one of the buried layers formed in the last one of the one or more epitaxial layers; and annealing the semiconductor substrate, the one or more epitaxial layers and the last epitaxial layer, wherein the first diffusion region and a first set of the buried layers formed in the one or more epitaxial layers are in vertical alignment to form a contiguous diffusion region of the first conductivity type and functions as an emitter region, and the second diffusion region and a second set of the buried layers formed in the one or more epitaxial layers are in vertical alignment to form a contiguous diffusion region of the first conductivity type and functions as a collector region, a base region being formed in the one or more epitaxial layers and the last epitaxial layer between the emitter and collector regions.

5. The method of claim 4, further comprising:

forming a third diffusion region of the first conductivity type in the last epitaxial layer, wherein the third diffusion region and a third set of buried layers formed in the one or more epitaxial layers are in vertical alignment with the first buried layer to form a contiguous diffusion region of the first conductivity type and function as an isolation structure.

6. The method of claim 5, wherein forming the first, second and third diffusion regions of the first conductivity type on the last epitaxial layer comprises:

forming first, second and third sinker regions of the first conductivity type on the last epitaxial layer as the first, second and third diffusion regions.

7. The method of claim 4, further comprising:

forming a fourth sinker diffusion region of the second conductivity type in the one or more epitaxial layers and extending to and being in electrical contact with the second buried layer.

8. The method of claim 4, wherein the first conductivity type is P-type conductivity and the second conductivity type is N-type conductivity.

9. A lateral bipolar transistor, comprising:

a semiconductor substrate of a first conductivity type;

an epitaxial layer of a second conductivity type formed on the substrate, the second conductivity type being opposite the first conductivity type;

a first buried layer of the second conductivity type formed between the substrate and the epitaxial layer;

first and second trenches formed in the epitaxial layer, the trenches being filled with at least a polysilicon layer being doped with dopants of the first conductivity type;

and first and second diffusion regions of the first conductivity type formed in the epitaxial layer surrounding sidewalls of respective first and second trenches, the polysilicon layer of each trench being in electrical contact with the respective diffusion region surrounding sidewalls of the respective trench; and a gate conductor layer formed over a gate dielectric formed over the epitaxial layer, the gate conductor layer being formed between the first and second trenches, wherein an emitter region is formed in the first trench and the first diffusion region, a collector region is formed in the second trench and the second diffusion region, the base region being formed in the epitaxial layer between the first and second diffusion regions associated with the first and second trenches.

10. The lateral bipolar transistor of claim 9, wherein the gate conductor is electrically connected to the emitter region and functions as a field plate for the base region.

11. The lateral bipolar transistor of claim 9, wherein a voltage is applied to the gate conductor to vary an emitter-to-gate breakdown voltage.

12. The lateral bipolar transistor of claim 9, further comprising:

a sinker diffusion region of the second conductivity type formed in the epitaxial layer and extending to and being in electrical contact with the first buried layer.

13. A lateral bipolar transistor, comprising:

a semiconductor substrate of a first conductivity type;

an epitaxial layer of a second conductivity type formed on the substrate, the second conductivity type being opposite the first conductivity type;

a first buried layer of the second conductivity type formed between the substrate and the epitaxial layer;

a well region of first conductivity type formed in the epitaxial layer;

a first trench formed in the epitaxial layer and a second trench formed in the well region of the epitaxial layer, the trenches being filled with at least a polysilicon layer being doped with dopants of the first conductivity type; and first and second diffusion regions of the first conductivity type formed in the epitaxial layer surrounding sidewalls of respective first and second trenches, the polysilicon layer of each trench being in electrical contact with the respective diffusion region surrounding sidewalls of the respective trench;

a field oxide layer formed in the well region and adjacent the second trench;

a gate conductor layer formed over a gate dielectric formed over the epitaxial layer and extends over the field oxide layer, the gate conductor layer being formed between the first and second trenches, wherein an emitter region is formed in the first trench and the first diffusion region, a collector region is formed in the second trench and the second diffusion region, the base region being formed in the epitaxial layer between the first diffusion region associated with the first trench and the well region.

14. The lateral bipolar transistor of claim 13, wherein a voltage is applied to the gate conductor to vary an emitter-to-gate breakdown voltage.

15. The lateral bipolar transistor of claim 13, further comprising:

a sinker diffusion region of the second conductivity type formed in the epitaxial layer and extending to and being in electrical contact with the first buried layer.

* * * * *